(12) United States Patent
Griffith et al.

(10) Patent No.: US 11,203,157 B2
(45) Date of Patent: Dec. 21, 2021

(54) THREE-DIMENSIONAL PRINTING PREPARATION

(71) Applicant: AUTODESK, INC., San Rafael, CA (US)

(72) Inventors: Saul Griffith, San Francisco, CA (US); Martin Wicke, San Francisco, CA (US); Keith Pasko, San Francisco, CA (US); Geoffrey Irving, San Francisco, CA (US); Sam Calisch, San Francisco, CA (US); Tucker Gilman, San Francisco, CA (US); Daniel Benoit, Alameda, CA (US); Jonathan Bachrach, Berkeley, CA (US)

(73) Assignee: AUTODESK, INC., San Rafael, CA (US)

( * ) Notice: Subject to any disclaimer, the term of this patent is extended or adjusted under 35 U.S.C. 154(b) by 94 days.

(21) Appl. No.: 16/373,576

(22) Filed: Apr. 2, 2019

(65) Prior Publication Data

US 2019/0228114 A1    Jul. 25, 2019

Related U.S. Application Data

(62) Division of application No. 13/859,058, filed on Apr. 9, 2013, now Pat. No. 10,248,740.

(Continued)

(51) Int. Cl.
*G06F 17/00* (2019.01)
*B33Y 50/00* (2015.01)
(Continued)

(52) U.S. Cl.
CPC ............ *B29C 64/386* (2017.08); *B33Y 50/00* (2014.12); *G06F 30/00* (2020.01)

(58) Field of Classification Search
CPC ........ B29C 64/386; G06F 30/00; B33Y 50/00
See application file for complete search history.

(56) References Cited

U.S. PATENT DOCUMENTS 5,825,369 A    10/1998    Rossignac et al.
5,905,507 A     5/1999    Rossignac et al.
(Continued)

OTHER PUBLICATIONS

Wang et al., "Hole filling of triangular mesh segments using systematic grey prediction", Elsevier, https://ac.els-cdn.com/S0010448512001455/1-s2.0-S0010448512001455-main.pdf?_tid-d67c3651-ed85-44a2-ac94-78ecae5e973c&acdnat=1530112115_a721 cb715312972b11 d08c1 a0ead3e45, Dec. 2012, pp. 1182-1189.

(Continued)

*Primary Examiner* — Charles R Kasenge
(74) *Attorney, Agent, or Firm* — Artegis Law Group, LLP

(57) ABSTRACT

Embodiments disclosed herein provide systems and methods for preparing geometry for 3D printing. In one embodiment, a 3D printing preparation application receives 3D geometry and repairs non-manifold edges and non-manifold vertices, producing a topological manifold geometry. The 3D printing preparation application then welds coincident edges without coincident faces and fills holes in the geometry. The 3D printing preparation application may further perform resolution-aware thickening of the geometry by estimating distances to a medial axis based on distances to distance field shocks, and advecting the distance field using a velocity field. A similar approach may be used to perform resolution-aware separation enforcement. Alternatively, one component may be globally thickened and subtracted from another for separation enforcement. The 3D printing preparation application may also split large models and add connectors for connecting the split pieces after printing. In (Continued)

A

B addition, the 3D printing preparation application may generate a 3D print preview.

15 Claims, 19 Drawing Sheets

Related U.S. Application Data

(60) Provisional application No. 61/621,942, filed on Apr. 9, 2012.

(51) Int. Cl.
*B29C 64/386* (2017.01)
*G06F 30/00* (2020.01)

(56) References Cited

U.S. PATENT DOCUMENTS

| | | | |
|---|---|---|---|
| 5,987,929 | A | 11/1999 | Bostani |
| 6,016,153 | A | 1/2000 | Gueziec et al. |
| 6,031,548 | A | 2/2000 | Gueziec et al. |
| 6,184,897 | B1 | 2/2001 | Gueziec et al. |
| 6,307,551 | B1 | 10/2001 | Gueziec et al. |
| 6,317,859 | B1 * | 11/2001 | Papadopoulou ........ G06F 30/39 716/135 |
| 6,445,389 | B1 | 9/2002 | Bossen et al. |
| 6,452,596 | B1 | 9/2002 | Gueziec et al. |
| 6,996,505 | B1 | 2/2006 | Edelsbrunner et al. |
| 7,034,823 | B2 | 4/2006 | Dunnett |
| 7,136,063 | B2 | 11/2006 | Loop |
| 7,240,306 | B2 * | 7/2007 | Allen ................... G06F 30/398 716/56 |
| 7,283,133 | B2 | 10/2007 | Loop |
| 7,362,328 | B2 | 4/2008 | Fenney et al. |
| 7,768,511 | B2 | 8/2010 | Fenney et al. |
| 7,825,925 | B2 | 11/2010 | Voth |
| 8,130,221 | B2 | 3/2012 | Voth |
| 8,175,734 | B2 | 5/2012 | Fogel et al. |
| 8,659,599 | B2 | 2/2014 | Carr et al. |
| 2002/0167516 | A1 | 11/2002 | Loop |
| 2004/0068712 | A1 * | 4/2004 | Heng ..................... G06F 30/39 716/52 |
| 2004/0075655 | A1 | 4/2004 | Dunnett |
| 2004/0075656 | A1 * | 4/2004 | Kimia ..................... G06T 17/00 345/420 |
| 2004/0113909 | A1 | 6/2004 | Fenney et al. |
| 2006/0050071 | A1 | 3/2006 | Fenney et al. |
| 2006/0098008 | A1 | 5/2006 | Holberg |
| 2006/0176300 | A1 | 8/2006 | Loop |
| 2007/0091086 | A1 | 4/2007 | Fenney et al. |
| 2008/0059929 | A1 * | 3/2008 | Papadopoulou ...... G06F 30/398 716/112 |
| 2008/0218509 | A1 | 9/2008 | Voth |
| 2008/0273034 | A1 | 11/2008 | Fenney et al. |
| 2009/0278844 | A1 | 11/2009 | Chang et al. |
| 2009/0309876 | A1 | 12/2009 | Dorbie |
| 2011/0074779 | A1 | 3/2011 | Voth |
| 2011/0087350 | A1 | 4/2011 | Fogel et al. |
| 2013/0124151 | A1 * | 5/2013 | Meeh ................... B29C 64/386 703/1 |
| 2013/0127857 | A1 | 5/2013 | Carr et al. |

OTHER PUBLICATIONS

Panchetti et al., "Towards recovery of complex shapes in meshes using digital images for reverse engineering applications", Computer-Aided Design, Elsevier, vol. 42, No. 8, Fig. 2, https://hal.archives-ouvertes.fr/hal-01019971 / document, Fig. 2, 2010, 693-707.

Tekumalla et al., "A Hole-Filling Algorithm for Triangular Meshes", University of Utah, https://www.researchgate.net/profile/Lavanya_Tekumalla2/publication/239719132_A_Hole-Filling_Algorithm_for_Triangular_Meshes/links/0a85e533e2d4 7 d33cc000000/A-Hole-Filling-Algorithm-for-Triangular-Meshes.pdf, Dec. 20, 2004, pp. 1-7.

Lai et al., "On the Development of a Hole Filling Algorithm for Triangular Meshes", Journal of the Chinese Institute of Engineers, vol. 30, No. 5, https://pdfs.semanticscholar.org/21fc/3047dc83ca483051e4a 1c3e6695deceb4467 .pdf, 2007, pp. 877-889.

* cited by examiner

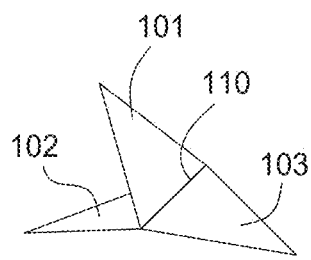
A
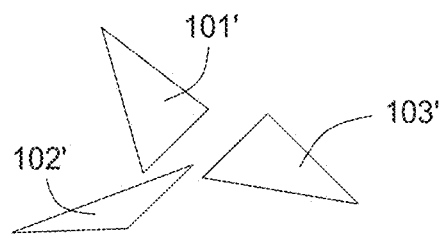
B
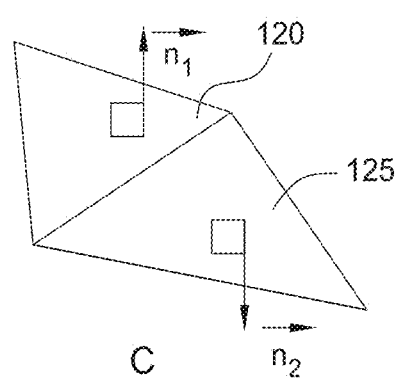
C
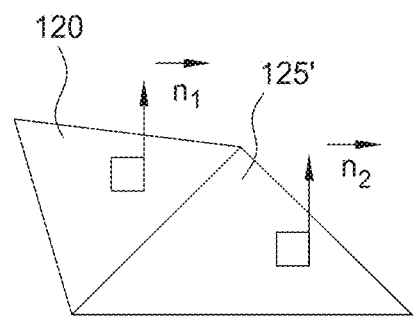
D
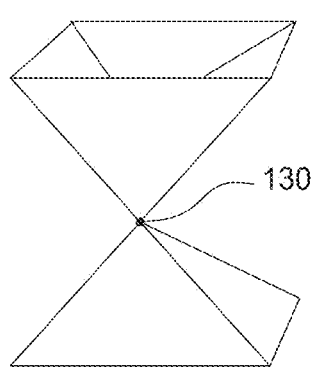
E
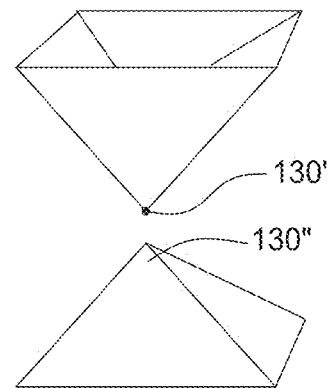
F
FIG. 1

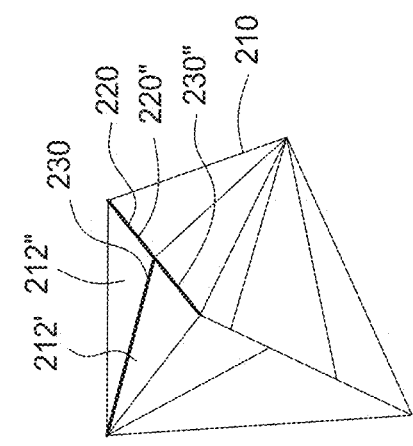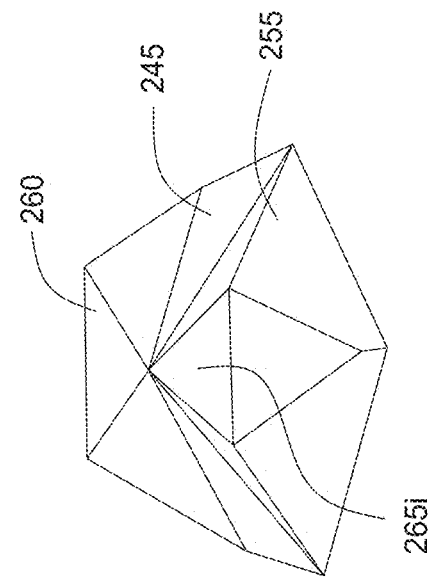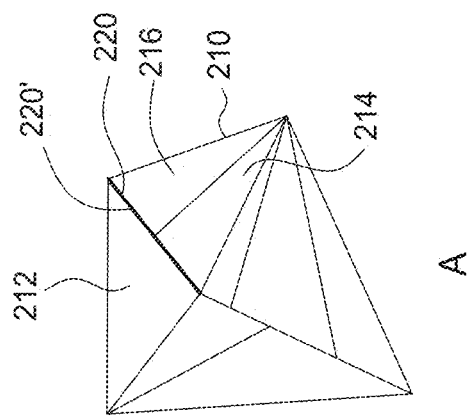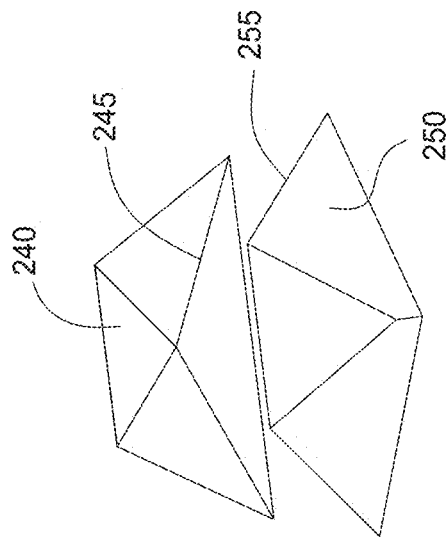
FIG. 2

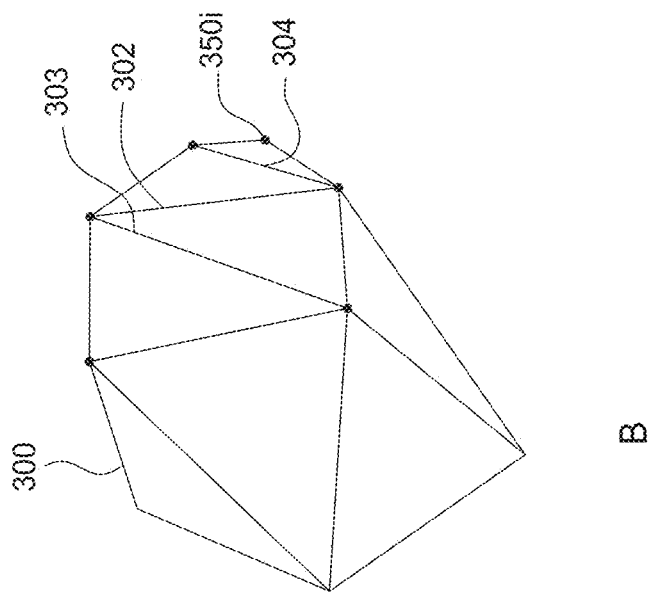
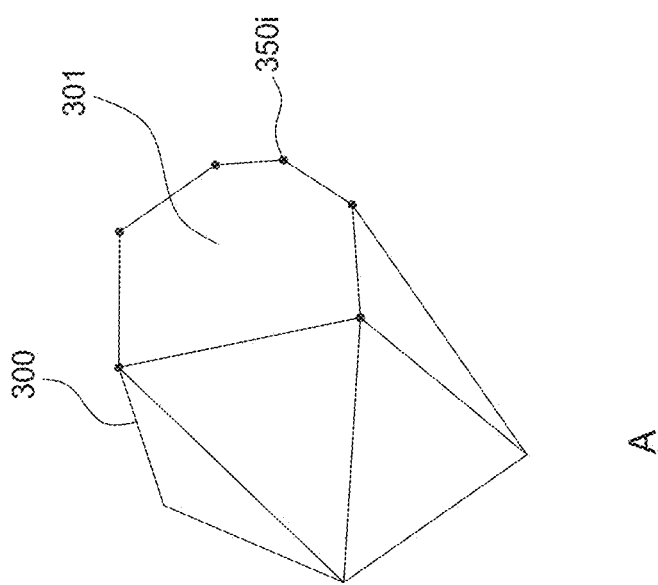
FIG. 3

THREE-DIMENSIONAL PRINTING PREPARATION

CROSS-REFERENCE TO RELATED APPLICATION

This application is a divisional of co-pending U.S. Patent Application titled, "THREE-DIMENSIONAL PRINTING PREPARATION," filed on Apr. 9, 2013 and having Ser. No. 13/859,058, which claims benefit of U.S. Provisional Patent Application titled, "PREPARATION, PREVIEW, AND SIMULATION FOR 3D PRINTING," filed on Apr. 9, 2012 and having Ser. No. 61/621,942. The subject matter of these related applications is hereby incorporated herein by reference.

BACKGROUND OF THE INVENTION

Field of the Invention

The present invention generally relates to computer software. More specifically, the present invention relates to techniques for preparing geometry for three-dimensional (3D) printing.

Description of the Related Art 3D printers print three-dimensional objects. 3D printers is analogous to conventional printers in that, e.g., the printer may apply layer after layer of a substrate until completing a desired 3D structure, much like conventional printers apply a layer of ink to paper. Various types of 3D printers have been designed, and these 3D printers use a variety of raw materials for printing.

Stringent requirements are typically imposed as to geometry that is admissible as input to 3D printers. In addition, 3D printers cannot perfectly reproduce arbitrary geometry, as 3D printers are limited by resolution, printer size, and accuracy, among other things. These limitations of 3D printers give rise to a number of problems. For example, 3D printers may be unable to print discrete geometry (e.g., encoded as STereoLithography (STL) or Additive Manufacturing File Format (AMF) files) without tedious pre-processing, and may be unable to print large models altogether. Even if a 3D printer succeeds in printing a model, small features may be smoothed out or disappear, potentially disconnecting parts connected by thin features, due to limitations in resolution. Separate neighboring pieces may also be fused due to resolution or accuracy limitations. In addition, due to production artifacts, the actual appearance and surface properties of printed objects may not be known until after the object is printed.

SUMMARY OF THE INVENTION

One embodiment sets forth a method for preparing 3D geometry for 3D printing. The method includes receiving the 3D geometry and identifying one or more non-manifold edges in the 3D geometry. For each non-manifold edge, the non-manifold edge is separated into a plurality of edges corresponding to faces meeting at the non-manifold edge, to create a set of patches. The method further includes orienting the patches so that coincident faces have topologically consistent normals, and iteratively stitching boundaries of the patches together.

Other embodiments include, without limitation, a computer-readable medium that includes instructions that enable a processing unit to implement one or more aspects of the disclosed methods as well as a system configured to implement one or more aspects of the disclosed methods.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 illustrates approaches for correcting non-manifold edges and vertices, according to an embodiment of the invention.

FIG. 2 illustrates approaches for correcting models which are not watertight, according to an embodiment of the invention.

FIG. 3 illustrates an approach for filling a hole in 3D geometry, according to an embodiment of the invention.

DETAILED DESCRIPTION OF THE PREFERRED EMBODIMENTS

Figure 4:
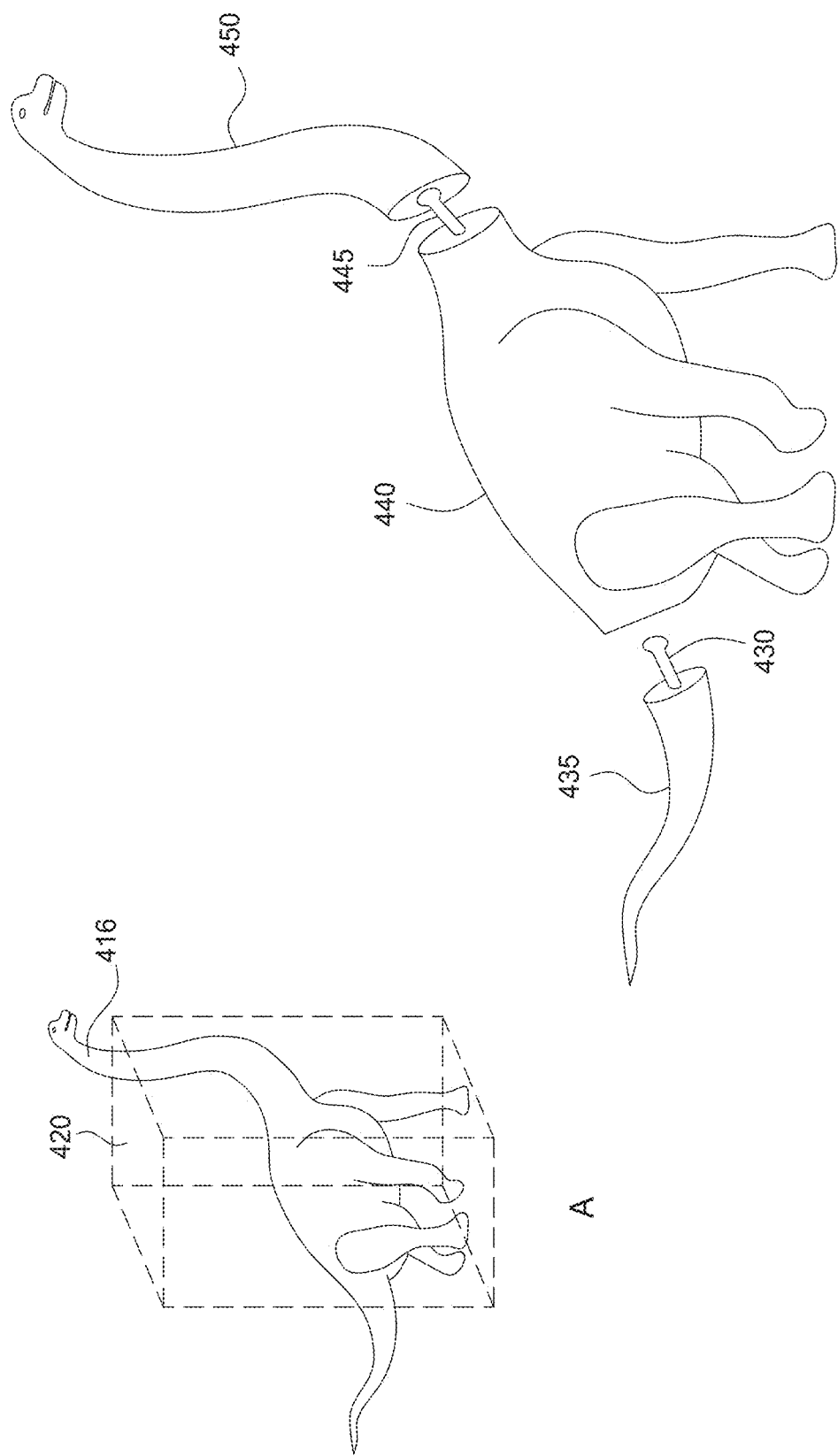
FIG. 4 illustrates an approach for splitting large meshes and adding connectors to the split parts, according to an embodiment of the invention.

Embodiments disclosed herein provide techniques for preparing geometry for 3D printing. Many 3D printers are unable to print non-manifold geometry, i.e., geometry that does not have a well-defined inside and outside. In one embodiment, a 3D printing preparation application receives 3D geometry (e.g., a triangle mesh or a set of triangles, each of whose edges may be merged to form a triangle mesh) and repairs non-manifold edges and non-manifold vertices, producing geometry which is a topological manifold.

The 3D printing preparation application then welds coincident edges without coincident faces and fills holes in the geometry. The 3D printing preparation application may further perform resolution-aware thickening of the 3D geometry by estimating distances to a medial axis based on distances to distance field shocks, and advecting the distance field using a velocity field. Doing so thickens small parts which would otherwise be smoothed out, disappear, be weak, etc. in printed instances of the 3D geometry. A similar approach may be used to perform resolution-aware separation enforcement to ensure that printed parts that are close are not fused together. Alternatively, one component may be globally thickened and subtracted from another for separation enforcement. The 3D printing preparation application may also split large models, which would otherwise not fit within the printer's printing volume, and add connectors for connecting the split pieces after printing. In addition, the 3D printing preparation application may generate a 3D print preview which depicts the appearance of the printed object.

FIG. 1 illustrates approaches for correcting non-manifold edges and vertices, according to an embodiment. Typically, 3D printers require geometry to define a clear inside and outside so that the 3D printer may deposit material on the inside and, except for support material, not deposit material on the outside. Non-manifold edges and vertices break this requirement. One type of non-manifold edge is an edge associated with more than two faces. As shown in panel A, edge 110 is associated with three faces 101-103, such that inside and outside are not well-defined. Another type of non-manifold edge is one in which faces associated with an edge are oriented inconsistently. As shown in panel C, face 120 has normal n1 that is opposing to a normal n2 of face 125. Conventionally, the orientations of triangles are defined by the order of their vertices, with triangles having clockwise-ordered vertices oriented opposite triangles having counter-clockwise-ordered vertices. The orientation of adjacent triangles may thus be determined from the orders of their respective vertices.

In one embodiment, the 3D PPA may correct non-manifold edges such as those depicted in panels A and C by separating each non-manifold edge into one edge for each face that meets in the edge. Panel B shows such a separation of the non-manifold edges of panel A. Separating each non-manifold edge into one edge for each face that meets in the edge results in a set of manifold patches, which the 3D PPA may orient by enforcing that neighboring triangles have topologically consistent normals. The 3D PPA may then iteratively stitch boundaries of the patches together based on criteria. This iterative stitching process removes non-manifold edges. Let a "zip" be a boundary between a given set of patches which does not change within the zip. If one patch stops and a new patch starts such that the boundary is between the new patch and other patches, then the boundary is another zip. In one embodiment, the stitching criteria may including stitching the longest zip first, and, for any zip, first stitching the patches whose normals incident to the zip are most similar (e.g., have the largest dot product). In another embodiment, the stitching criteria may, e.g., give preference to boundaries associated with patches forming substantially right angles, as this may be a right-angle corner of the geometry. If any patch is incident to a zip twice, then the patch is considered to be connected to itself at this point, and the zip is processed ignoring the two instances of said patch.

Panel E shows a non-manifold point 130. There is no well-defined inside and outside at the non-manifold point 130, as it is possible to go in "inside" the object in two different directions starting from the non-manifold point 130. In one embodiment, the 3D PPA may split all non-manifold points into two points, as shown in panel F, thereby correcting the non-manifold point.

FIG. 2 illustrates approaches for correcting models which are not watertight, according to an embodiment. As discussed, 3D printers may require geometry to define a clear inside and outside. Such a well-defined inside and outside is lacking where the geometry is not watertight. As shown in panel A, a model 210 includes coincident edges 220, 220' that do not share coincident vertices, as the vertex 215 of triangles 214 and 216 is not also a vertex of triangle 212. Coincident edges without coincident vertices define holes having zero area, and may cause problems in inside/outside tests. To remedy such problems, the 3D PPA may split one (or more) of the coincident edges with the vertex or vertices which it lacks, as shown in panel B. As shown, the geometry of panel B has no coincident edges whose vertices are not also coincident.

Panel C shows a different type of non-watertight geometry, namely one in which connected boundaries 245, 255 of parts 240 and 250, respectively, are within a small distance of each other, but not actually coincident. The 3D PPA may identify such edges as the edges which are close in absolute distance but far in geodesic distance. The 3D PPA may then insert triangles (e.g., triangle $265_i$) to connect the identified edges, as shown in panel D. Note, such insertions may be of small or thin triangles, as the seam between the edges may itself be thin. In one embodiment, the 3D PPA may repair the inserted triangles by, e.g., performing edge flips, decimations, edge collapses, etc., thereby reducing the number of small or thin triangles.

FIG. 3 illustrates an approach for filling a hole in 3D geometry, according to an embodiment. 3D printers are sometimes unable to print geometry having holes. As shown, the boundary of hole 301 is a closed loop of vertices (e.g., vertex $350_i$), which a 3D printing preparation application (PPA) may identify by marching the triangle mesh 300. The 3D PPA may then iteratively insert edges to fill the hole 301. As shown in panel B, edges 302-304 have been inserted. In one embodiment, the 3D PPA may insert edges according to some priority measure. Experience has shown that useful priorities include, shortest edges first, edges along a preferred direction first, and edges closest to a predefined surface first.

FIG. 4 illustrates an approach for splitting large meshes and adding connectors to the split pieces, according to an embodiment. 3D printers typically have limited printing volume, such that objects larger than the printing volume of a given printer cannot be printed by that printer. As shown in panel A, a model 410 is too large to be printed by a 3D printer having printable volume represented by ghosted lines 420. Illustratively, the PAA may split the model 410 into pieces 430, 440, 450, which are individually printable, by intersecting the geometry of the model 410 with geometry representing the printable volume 420, and splitting the model 410 along the intersections. In addition, the PAA may attempt to merge pairs of adjacent pieces by determining if their union is smaller than the printer volume, and merging the pieces if such is the case. Doing so may reduce the number of pieces to print.

In alternative embodiments, the 3D PPA may split large meshes in other ways. In one embodiment, the 3D PPA may cut the meshes in places having maximum cross section so that many connectors may be placed to join the pieces. In another embodiment, the 3D PPA may cut the meshes in places having minimum cross section, as those places are already weak. In a further embodiment, the 3D PPA may place cuts to so as to produce minimal visible seams. In yet another embodiment, the 3D PPA may determine intersections necessary to separate the geometry based on a user-specified location. For example, the 3D PPA may choose a cut plane close to the user-specified location and walk on the mesh in all directions as far as possible without crossing the cut plane and mark that region as belonging to one piece, and identify other pieces in a similar manner. Note, the 3D PPA may also handle instances where one surface includes another surface within it from a cross-sectional viewpoint. Here, the 3D PPA may identify intersection curves, and where one intersection curve contains another, smaller intersection curve, the 3D PPA may cut both.

As shown in panel B, the pieces 430, 440, 450 may be printed separately, as each piece fits within the printing volume 420. As further shown, the 3D PPA may place connector components 435, 445 on the pieces 430, 440 so that the printed pieces can be connected together to form the original object 410. Note, connector components (not shown) may also be placed on piece 450. In one embodiment, the connector may be placed at locations that are at least a given distance from outer boundaries of their respective pieces to ensure that the connector does not detach from the parts after printing. For example, the 3D PPA may choose a random placement location for the connector, then determine whether the location is at least a given distance from the outer boundary. If not, then the connector may make a number of further attempts, until a suitable location is found or no suitable location is found a user is notified about this error. In other embodiments, the 3D PPA may attempt to place multiple connectors as far from each other as possible, or equally spaced from each other.

Figure 5:
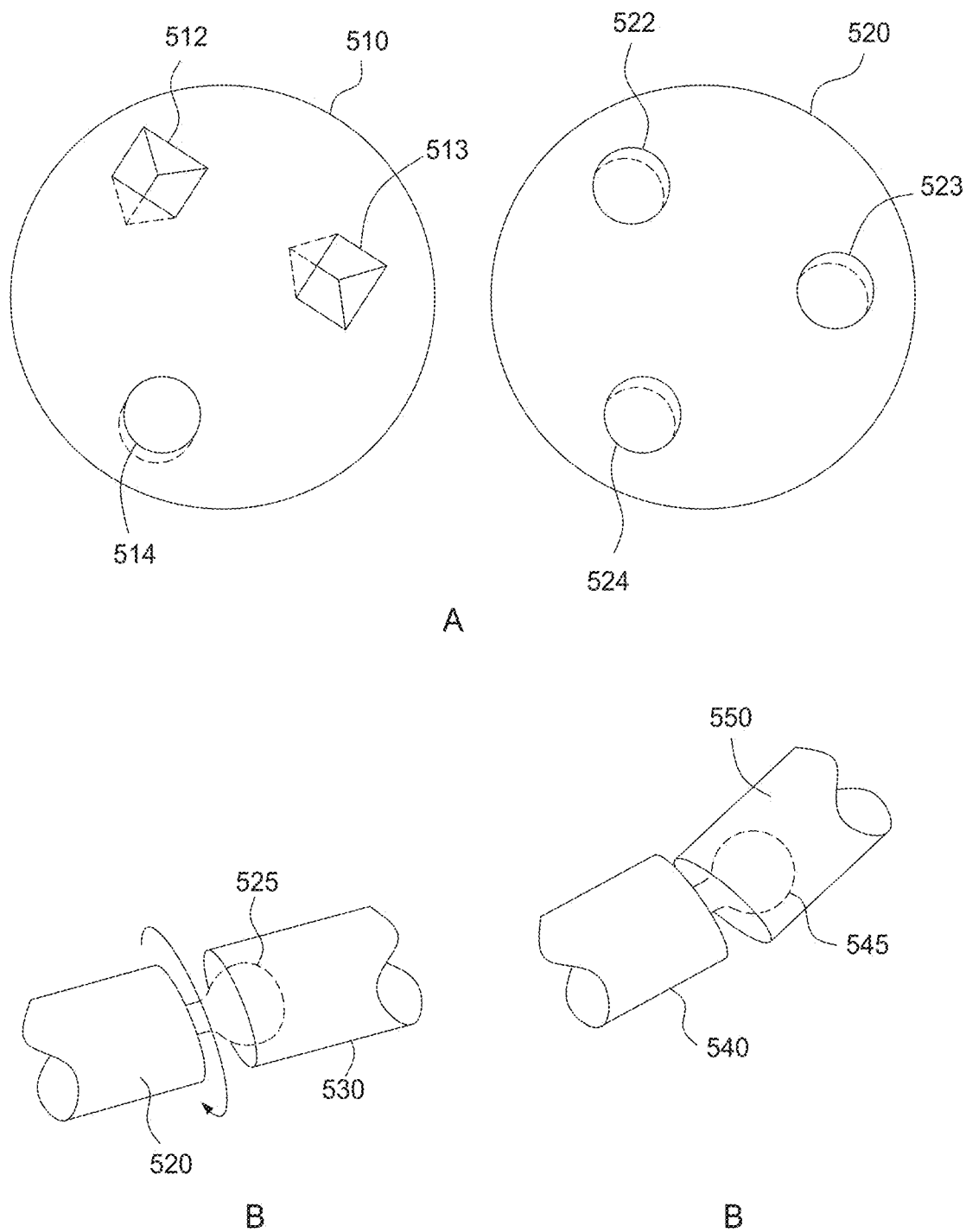
FIG. 5 illustrates various types of connectors for connecting printed parts, according to an embodiment of the invention.

FIG. 5 illustrates various types of connectors for joining printed parts, according to an embodiment. Other connectors that are not shown, such as rim joints, snap-locks, twist-locks, dowell connectors, etc. may also be used in some embodiments. As shown in panel A, opposing pieces 510, 520 include ends of connectors 512-514 and 522-524, respectively. The ends 522-524 are convex hemispheres protruding from the piece 520. Each of the ends 522-524 may fit into one of the ends 512-514. As shown, end 514 has a concave bowl, whereas ends 512 and 513 are v-shaped grooves oriented orthogonally. The orthogonal orientations of the ends 512 and 513 constrain the motion of the pieces 510, 520 with each other both horizontally and vertically. The bowl shape constrains any residual rotational degree of freedom due to manufacturing tolerances, while not over-constraining the system. Such constraints on motion may guarantee desired repositioning of one piece with respect to another. Note, one translational degree of freedom may be permitted by using only connectors which include one of end 512 or end 513.

Panel B shows a rotary joint 525 connecting opposing pieces 520 and 530. As shown, the rotary joint 525 permits one rotational degree of freedom. For rotation in all degrees of freedom, a ball and socket joint may be used. Panel C shows such a ball and socket joint 545 connecting opposing pieces 540 and 550. Here, the ball and socket joint 545 include a round end attached to part 540, which may be inserted into a bowl-shaped end attached to piece 545.

Figure 6:
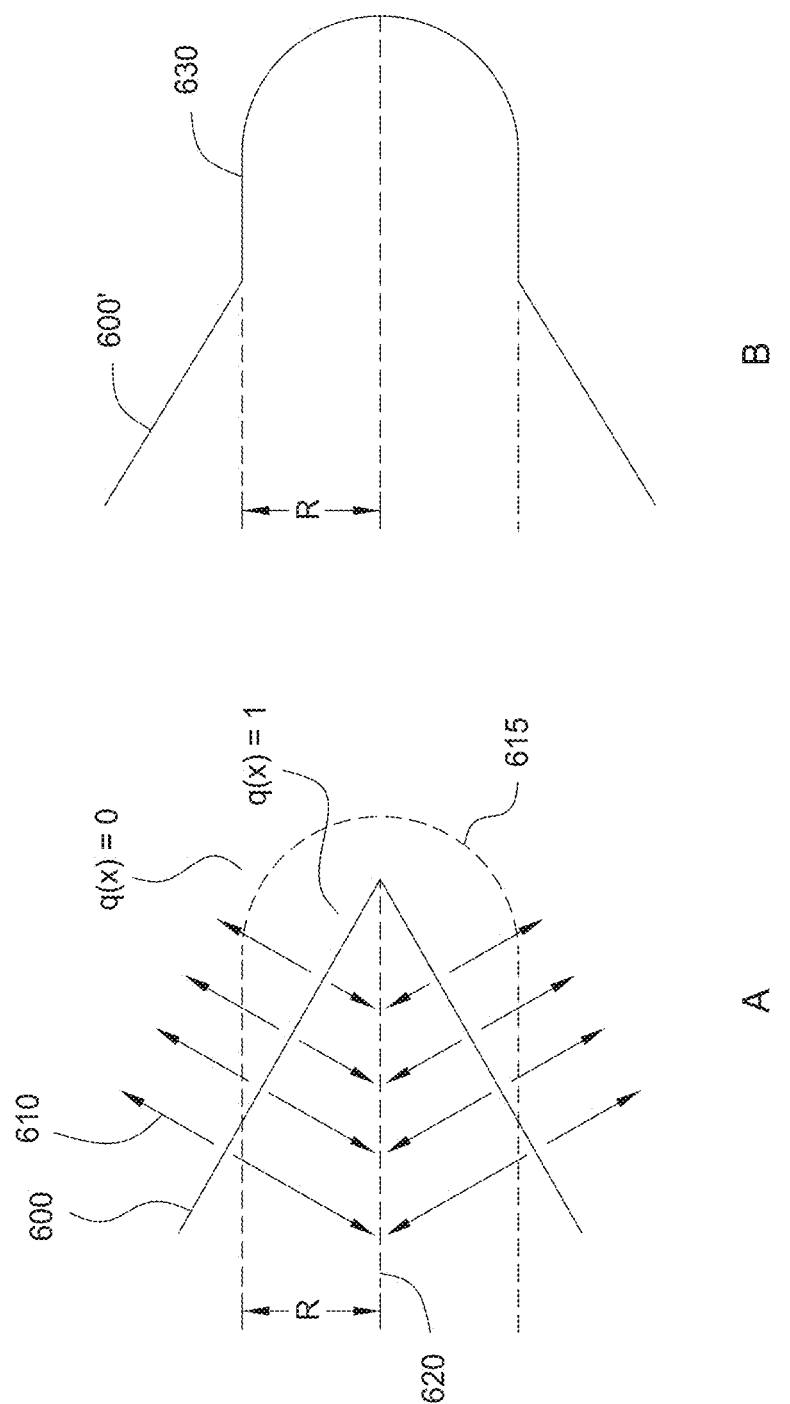
FIG. 6 illustrates an approach for thickening components which are too thin to be printed properly, according to an embodiment of the invention.

FIG. 6 illustrates an approach for thickening parts which are too thin to be printed properly, according to an embodiment. For example, parts of an object that are below the resolution of a 3D printer may be so thin that those parts fall apart after being printed, or cannot be printed at all due to restrictions of the 3D printer's hardware (manufacturing process) or software. The 3D PPA may identify and thicken such parts. In one embodiment, the 3D PPA may estimate a local feature size, defined as the distance from a point on the surface to a medial axis 620 of the object 600, by determining distances from points on the surface of the object 600 to the closest shocks in a distance field 610. Here, the distance to the closest shock may be used as a proxy for the distance to the medial axis 620, which can be more difficult to compute. Illustratively, the distance field 610 is a vector field pointing away from the surface of the object 600. Shocks in the distance field occur where normals of the distance field 610 change abruptly, and are not $C_1$ continuous. Illustratively, the normals of the distance field 610 point in opposite directions at the shock. The 3D PPA may identify such shocks and approximate the distance to the medial axis 620 from the surface, i.e., the set of points having more than one closest point on the surface, as the distance to the closest shock.

After approximating the distance to the medial axis 620, the 3D PPA may advect the distance field using a velocity field $q(\vec{x})$ which is substantially 1 where the distance to the medial axis 620 is less than half the printer resolution, denoted R, and 0 otherwise. As used herein, a velocity field is a field defining a velocity at points in space. A boundary 615 between the regions of velocity field $q(\vec{x})$ that are substantially 1 and 0 is shown in ghosted lines. By advecting the distance field, the thickness of parts that are thin may be increased. That is, the 3D PPA moves the surface of the 3D geometry by changing an implicit representation of the surface. The distance field gives a distance to the surface, e.g., at various discrete grid points, and is moved according to the velocity field. The grid may then be resampled to give a new distance field, with the new surface where this distance field is 0. As shown in panel B, the surface of the object 600 is expanded up to the boundary 615, so that the object 600 may be printed correctly at resolution R.

In one embodiment, the 3D PPA may avoid destroying details by deleting only those parts of the object that were moved by advection. The 3D PPA may then extract the surface of the advected distance field in cells that have moved significantly (e.g., by at least some threshold amount). The 3D PPA may then stitch these parts together to form a new watertight surface.

Figure 7:
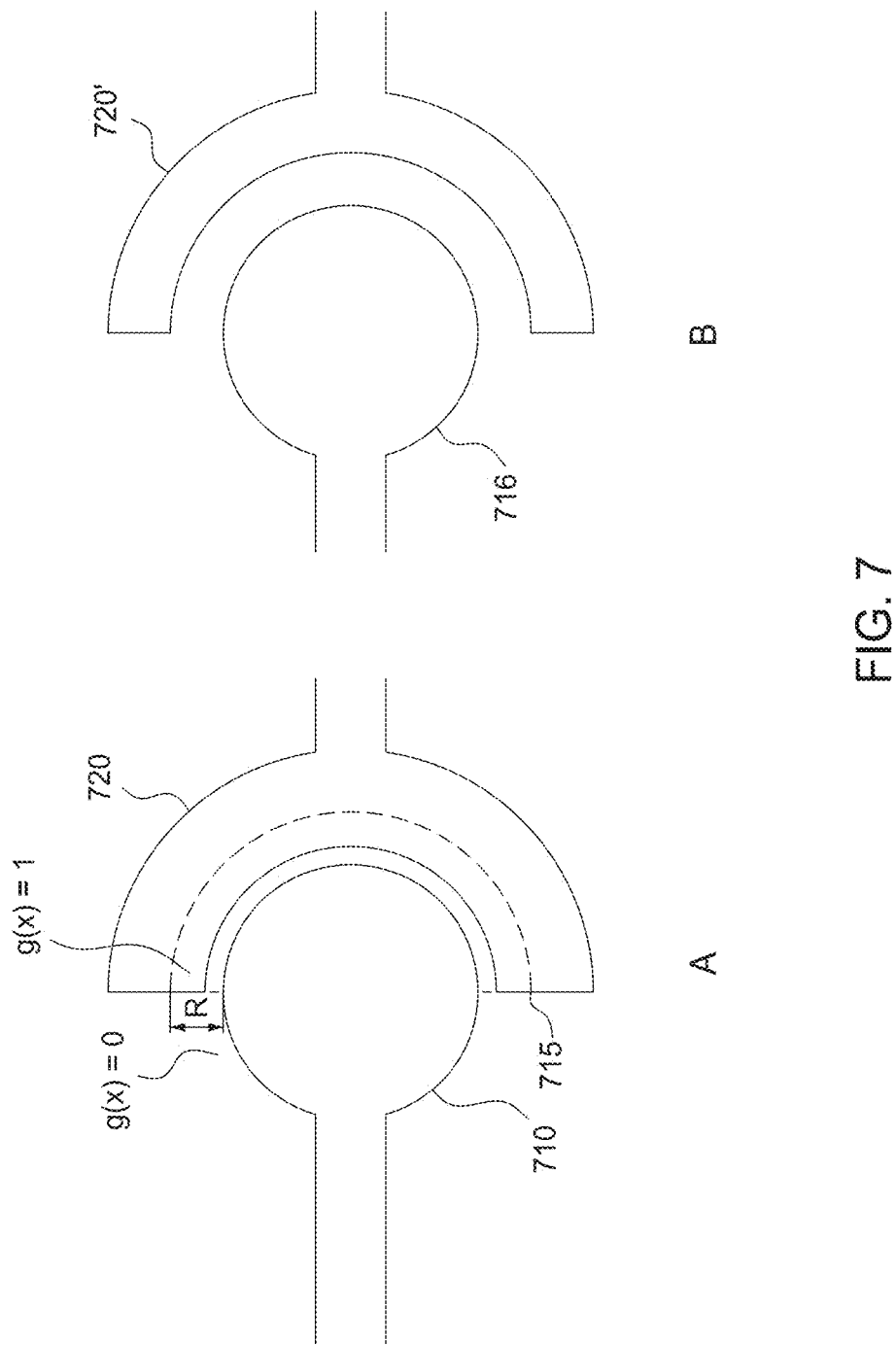
FIG. 7 illustrates an approach for enforcing separation between printed parts, according to an embodiment of the invention.

FIG. 7 illustrates an approach for enforcing separation between printed parts, according to an embodiment. For example, parts of an object may be so close that the resolution of a 3D printer is unable to resolve the gap between the parts. The 3D PPA may identify and separate such parts. In one embodiment, the 3D PPA may determine a distance field for each of the components 710 and 820. Then, similar to resolution-aware thickening, the 3D PPA may advect the distance field using a velocity field $g(\vec{x})$ which is substantially 1 where the distance to the closest point on the point of any other (but not the same component) is less than the resolution R, and 0 otherwise. A boundary 715 between these regions is shown in ghosted lines. By advecting the distance field, the separation between components which are closer than R are increased, while maintaining the separation of components that are further apart.

As shown in panel B, the surface of the object 720 retracts up to the boundary 715, so that the components 710 and 720 may be printed as separate components at resolution R. As with resolution-aware thinning, remeshing and stitching of the thinned mesh may also be performed, as appropriate. Note, although functions $g(\vec{x})$ and $q(\vec{x})$ are described above with respect to R, the values used need not be the same (e.g., one could use $R_1$ and another $R_2$).

Figure 8:
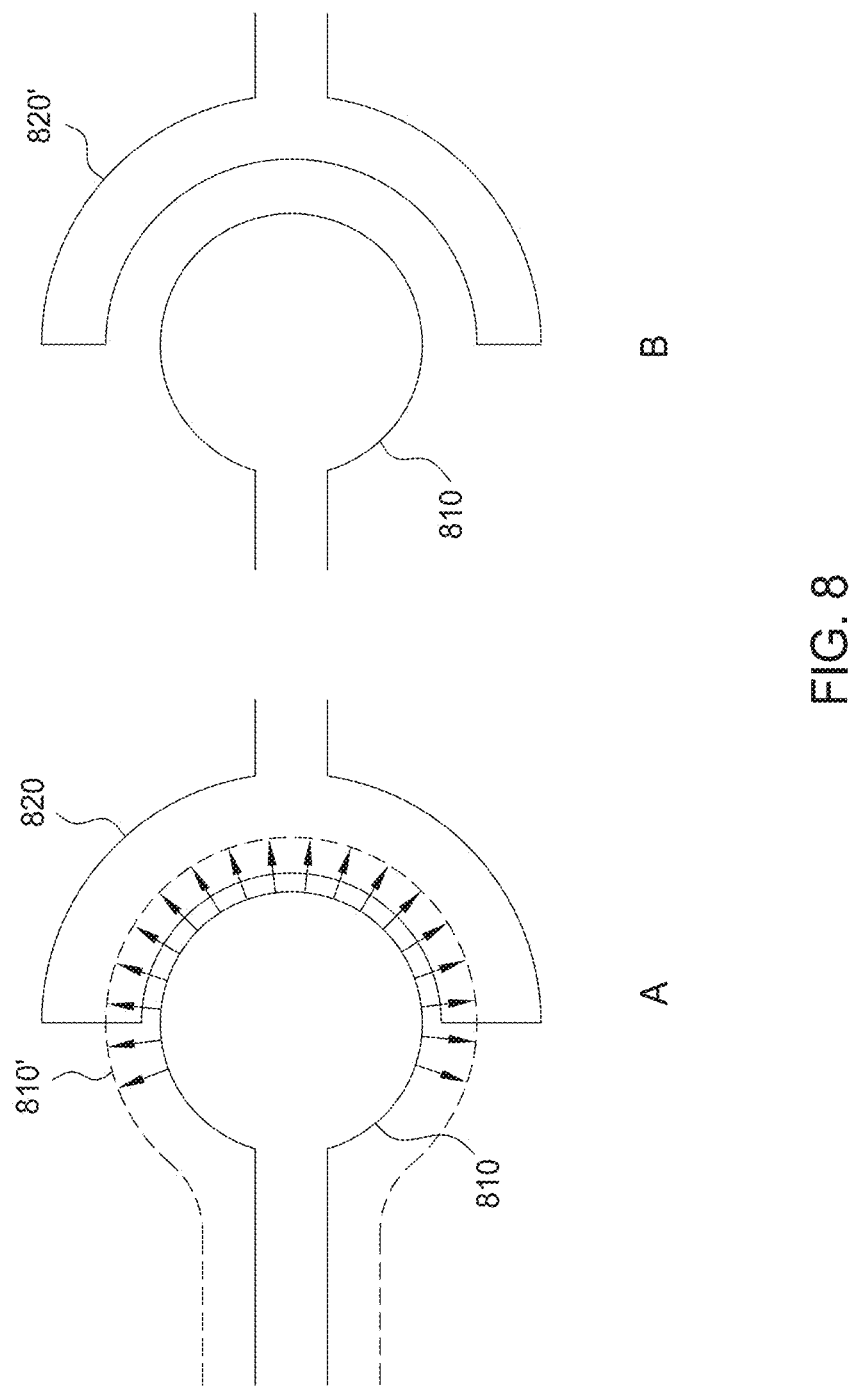
FIG. 8 illustrates an alternative approach for enforcing separation between printed parts, according to an embodiment of the invention.

FIG. 8 illustrates an alternative approach for enforcing separation between printed parts, according to an embodiment. As shown, the 3D PPA globally thickens component 810 and subtracts the thickened component 810' from the other component 820. The component 810 may be thickened by, e.g., the printer resolution R. The subtraction of this thickened component from the other component 820 permits the components 810 and 820 to be printed as separate components at resolution R. Here, remeshing and stitching of the thinned mesh 820 may also be performed, as appropriate.

Figure 9:
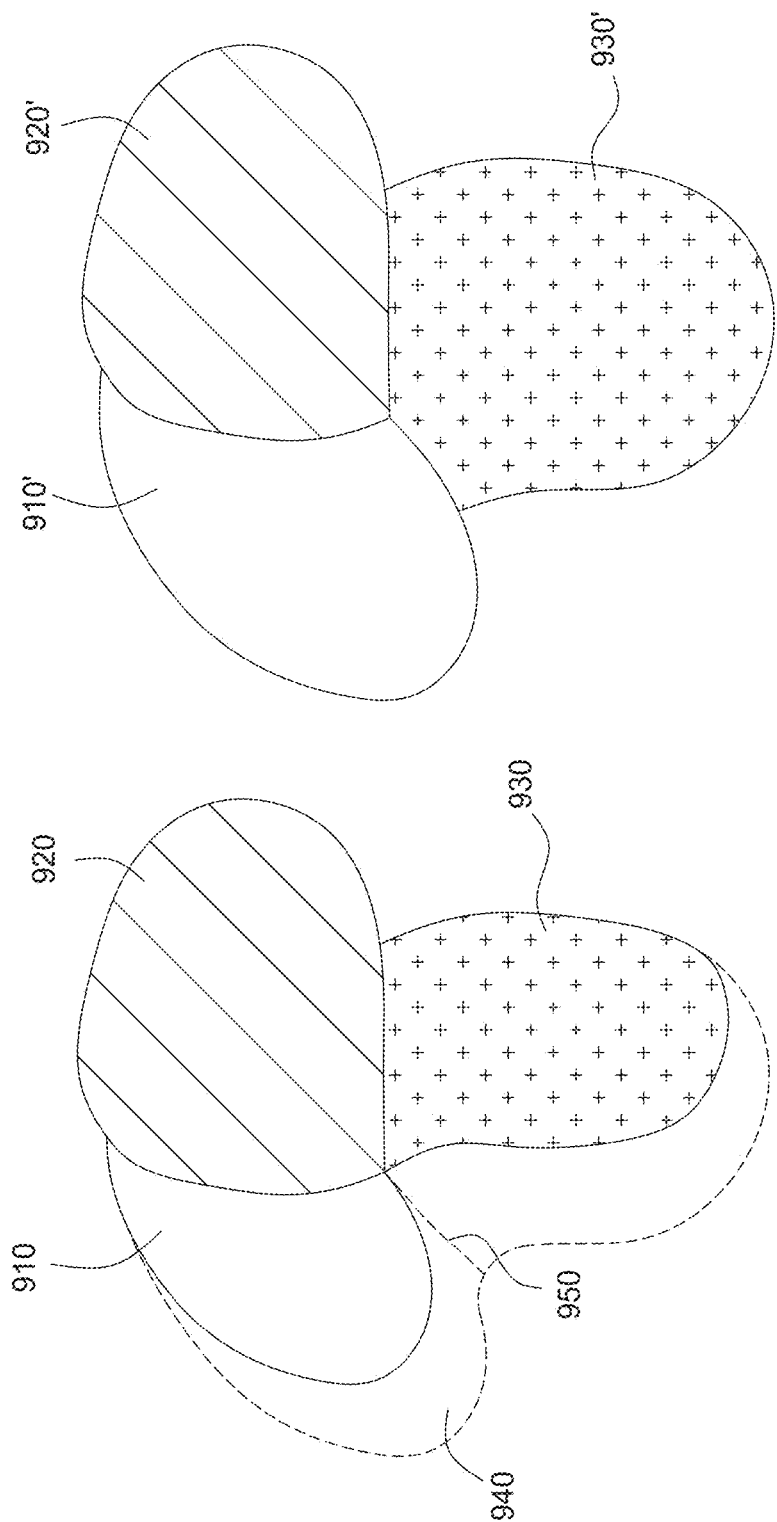
FIG. 9 illustrates an approach for printing thickened parts composed of multiple materials, according to an embodiment of the invention.

FIG. 9 illustrates an approach for printing thickened parts composed of multiple materials, according to an embodiment. As shown, the object 900 includes parts 910, 920, and 930 that are made of different materials. After thickening the object 900, the 3D PPA may determine which material(s) to use to fill empty portions of the volume bounded by the expanded surface 940. That is, the 3D PPA may determine how to extend the internal divisions between the materials in original object 900 to new regions resulting from the thickening process. For each part of the object 900 having a unique material, the 3D PPA may compute an implicit surface that is equidistant from that part and the union of all other parts having respective unique materials. For example, the surface 950 is equidistant from part 930 and the union of parts 910 and 920. The 3D PPA may determine an intersection between the expanded surface 940 and the implicit surface 950, giving volumes 952 and 953. Each of the volumes 952 and 953 may then be filled with the same material as that of one of the parts 910-930 closest to the respective volume 952-953. Illustratively, volume 952 may be filled with the same material as part 930, and volume 953 may be filled with the same material as part 910, resulting in the object 900' shown in panel B.

Figure 10:
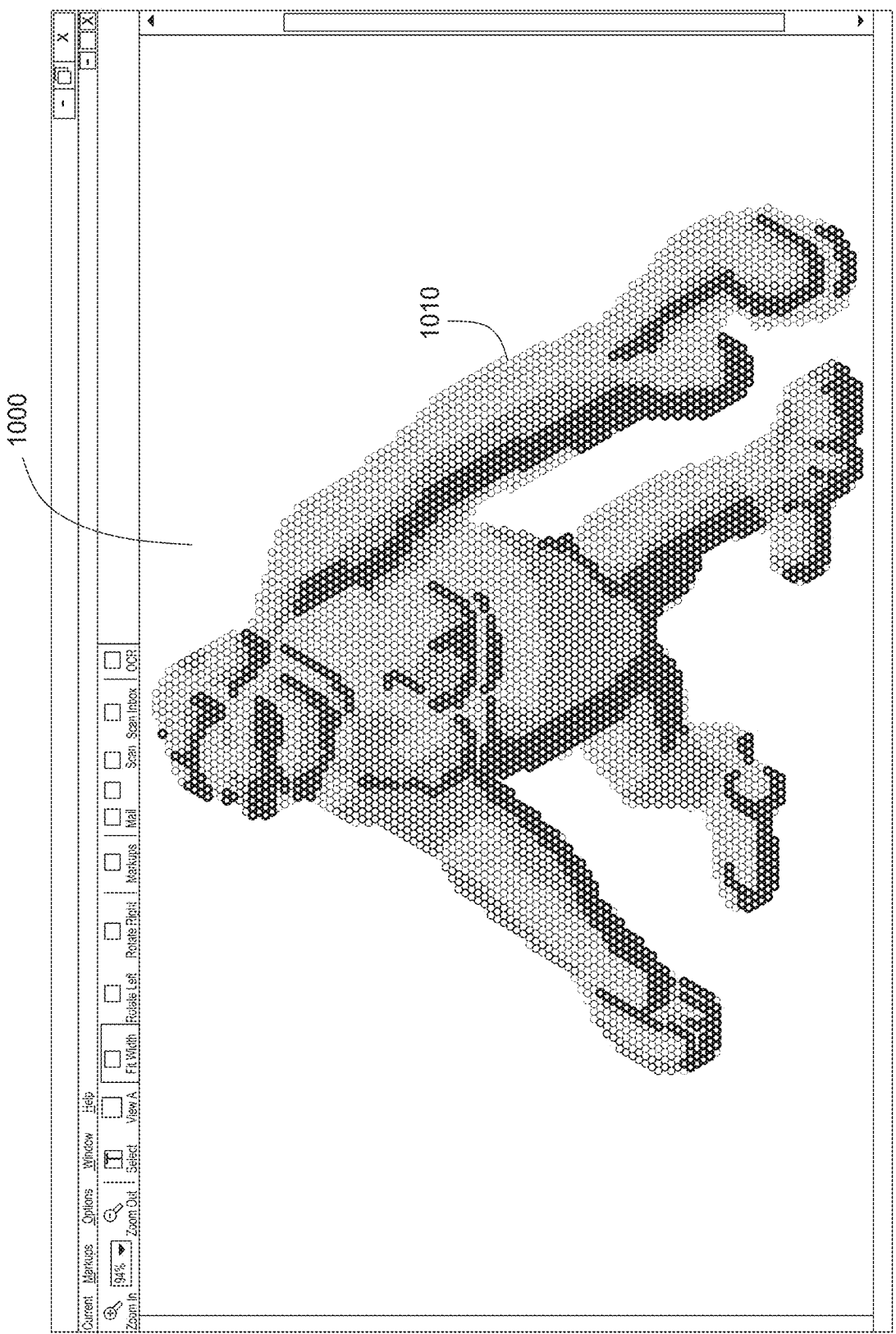
FIG. 10 illustrates a 3D print preview showing a simulation of the printing process, according to an embodiment of the invention.

FIG. 10 illustrates a 3D print preview 1000 showing a simulation of the printing process, according to an embodiment. As shown, a model 1010 is to be printed on a fused deposition modeling printer, which may, e.g., lay down thermoplastic beads in layers to form the final object. Due to discretization, the appearance of materials, printing artifacts, directional textures, and the like, it may be difficult for a user to imagine how a printed object would actually look. For example, at low printing resolutions, the thermoplastic beads may be clearly visible, in contrast to a user's expectations. As another example, parts of a printed object that are encased in support material during printing may have a different surface texture than the rest of the printed object. Illustratively, the print preview 1000 includes a rendering of 3D geometry that shows these and other printing effects to the user prior to printing. As shown, the output geometry has a tubular shape generated by following the expected movement of the printer head in printing the model 1100. The tube may further be textured to show the microstructure of the material, such as the surface texture due to being enclosed by support material.

Figure 11:
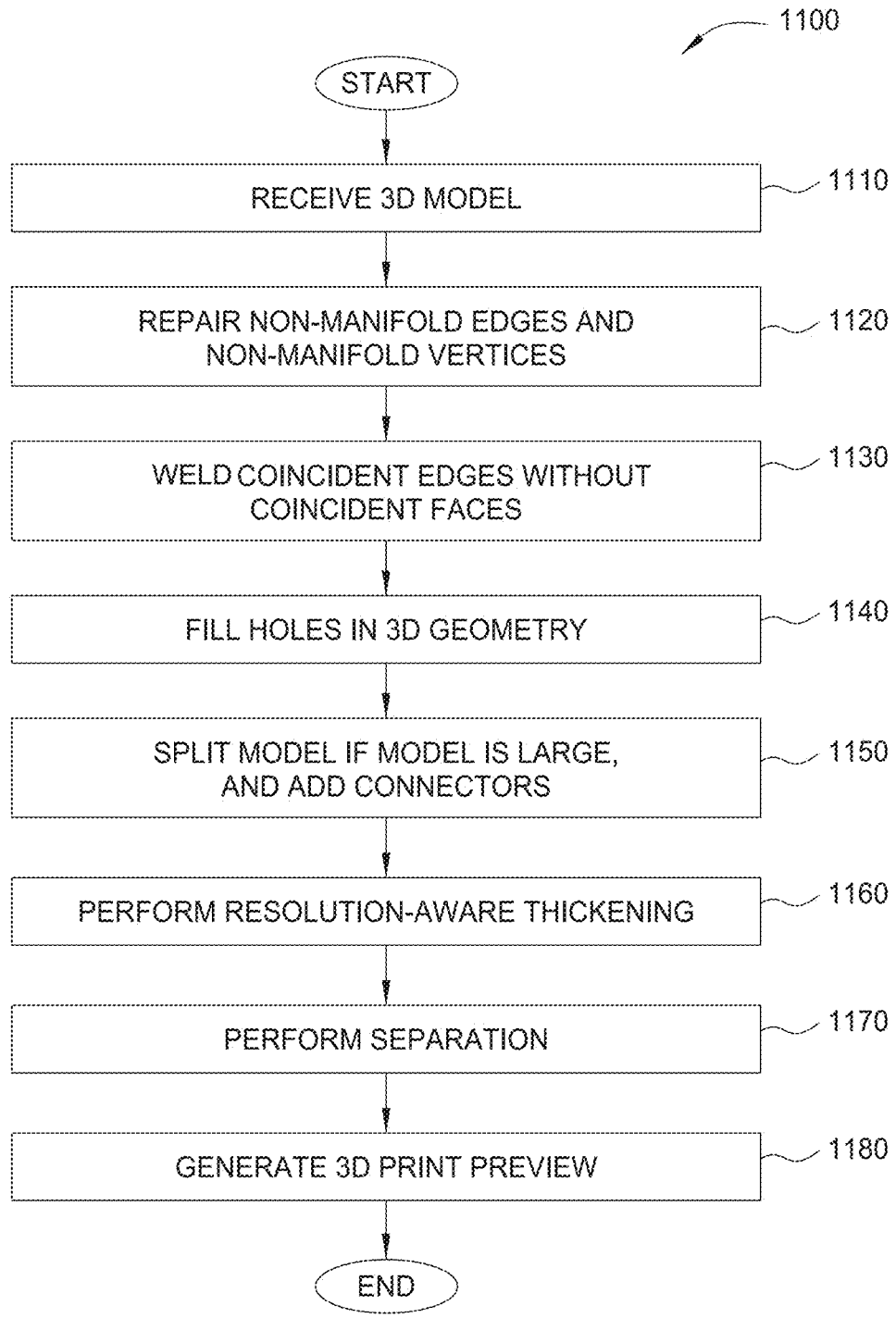
FIG. 11 illustrates a method for preparing geometry for 3D printing, according to an embodiment of the invention.

FIG. 11 illustrates a method 1100 for preparing geometry for 3D printing, according to an embodiment. As shown, the method 1100 begins at step 1110, where a 3D PPA receives a 3D model. For example, the 3D model may be a triangle mesh encoded as a STereoLithography (STL) or an Additive Manufacturing File Format (AMF) file. At step 1120, the 3D PPA repairs non-manifold edges and non-manifold vertices. As discussed, a non-manifold edge may be associated with more than two incident faces, or two faces that are oriented inconsistently. In one embodiment, the 3D PPA identifies non-manifold edges and separates the non-manifold edges into one edge for each face, creating a set of patches, before orienting the patches so that neighboring triangles have topologically consistent normals, and iteratively stitching together coincident patch boundaries according to priority criteria. As discussed, a non-manifold vertex is part of more than one edge-connected surface component. In one embodiment, the 3D PPA may identify non-manifold vertices and duplicate the non-manifold vertices, assigning one vertex to one surface component and the other vertex to another surface component, thereby separating the surface components.

At step 1130, the 3D PPA performs welding of coincident edges without coincident faces. It is not uncommon for geometry to not be watertight, and thereby non-manifold. Typical problems include edges which are coincident but do not share the same vertices, thereby defining zero-area holes, and edges that are close but not completely coincident. In one embodiment, the 3D PPA identifies completely coincident edges which do not share the same vertices and performs an edge split with the non-shared vertices (or vertex). That is, an edge split is performed to remedy completely coincident edges. The 3D PPA further determines that edges are close, but not completely coincident, by identifying edges that are close in absolute distance but far in geodesic distance. The 3D PPA may then insert triangles to connect such identified edges. In addition, the 3D PPA may repair the inserted triangles by, e.g., performing edge flips, decimations, edge collapses, etc., thereby reducing the number of small or thin triangles.

At step 1140, the 3D PPA fills holes in the geometry of the model. Many 3D printers are unable to print geometry having holes. In one embodiment, the 3D PPA may march the triangle mesh to determine boundaries of holes. The 3D PPA may then select a hole to process and insert an edge connecting two vertices on the hole boundary according to priority criteria, after which the 3D PPA recursively inserts edges according to the priority criteria for the hole or holes that result from any previously inserted edges. In some embodiments, the priority criteria may include, e.g., processing shortest edges first, edges along a preferred direction first, or edges that are closest to a predefined surface first. If more holes remain after the recursive insertion of edges to fill a given hole, the 3D PPA may select and process the remaining holes in a similar manner.

At step 1150, the 3D PPA splits the 3D model if the model is large, and adds connectors. As discussed, 3D printers typically have limited printing volume, such that objects larger than the printing volume of a given printer cannot be printed by that printer. The PAA may split a 3D model which is too large to be printed by a 3D printer into pieces which are individually printable. In one embodiment, the 3D PPA may stamp out the pieces from the 3D model. More specifically, the 3D PPA may determine the intersection of the 3D geometry with a box (or other shape) which represents the printing volume, and split the 3D geometry along the intersections. Then, the 3D PPA may merge pairs of adjacent pieces if their union is smaller than the printer volume. Of course, the 3D PPA may make other cuts, such as in places having maximum cross section, in places having minimum cross section, in places so as to produce minimal visible seams, based on a user-specified location, etc.

In addition, the 3D PPA may place connectors on the pieces so that the printed pieces may be joined together to form the original object. The particular types of connectors that are placed may depend on, e.g., the desired number of degrees of freedom, the kind of object being split, where the split is located, etc. In one embodiment, the connector may be placed at locations that are at least a given distance from outer boundaries of the pieces to ensure that subtracting the connector geometry does not create thin walls that are prone to fracture. In other embodiments, the 3D PPA may attempt to place multiple connectors as far from each other as possible, or equally spaced from each other.

At step 1160, the 3D PPA performs resolution-aware thickening. Parts of an object that are below the resolution of a 3D printer may be too thin to be printed properly by the 3D printer. The 3D PPA may identify and thicken such parts. In one embodiment, the 3D PPA may estimate a medial axis of the object based on distance field shocks and advect the distance field using a velocity field which is substantially 1 where the distance is less than the resolution R, and 0 otherwise. The 3D PPA may move the surface of the 3D geometry by changing an implicit representation of the surface. The distance field gives a distance to the surface, e.g., at various discrete grid points, and is moved according to the velocity field. The grid may then be resampled to give a new distance field, with the new surface where this distance field is 0.

Advecting the distance field using the velocity field may increases the thickness of parts to at least the resolution of the 3D printer. For multimaterial printing, the 3D PPA may further determine equidistant surfaces between each material and the union of all other surfaces. The 3D PPA may then determine, for each material, the intersection of its corresponding equidistant surface to the boundary of the thickened object, and fill the volume inside the boundary and the equidistant surface with that material. Doing so permits the internal divisions between the materials in the original object to be extended to new regions resulting from the thickening process.

At step 1170, the 3D PPA performs separation. Parts of an object which are close, but not touching, may be fused together during printing if the 3D printer's resolution is insufficient to resolve the gap between the pieces. This problem may be resolved in a similar manner as resolution-aware thinning, discussed above. In one embodiment, the 3D PPA may determine a distance field for points on the object from the closest points on any other object, then advect the distance field using a velocity field which is substantially 1 where the distance to the closest point on the point of any other (but not the same component) is less than the resolution R, and 0 otherwise. In an alternative embodiment, the 3D PPA may globally thicken one piece and subtract the thickened piece from the other piece.

At step 1180, the 3D PPA generates a 3D print preview. As discussed, due to discretization, the appearance of materials, printing artifacts, directional textures, and the like, it may be difficult for a user to imagine how a printed object would actually look. The 3D PPA may generate a print preview which shows these and other effects of the printing process.

For printers with coarse to medium resolution, the 3D PPA may simulate the printing process by generating geometry that reproduces the printing process. For example, to simulate fused deposition modeling, the 3D PPA may generate output geometry having a tubular shape which follows the expected movement of the printer head. In one embodiment, the tube may be textured to show the microstructure of the material.

For higher-resolution printers, it may be unnecessary to generate output geometry different from input geometry. However, the microstructure introduced by the printing process may result in surface effects discussed above. In one embodiment, these surface effects may be represented in a volumetric texture which provides color and is further used as a bump map. The volumetric texture may be, e.g., a two-dimensional texture that is projected onto the object from a direction perpendicular to the print layers. In another embodiment, a displacement map may be used for greater accuracy.

Although discussed herein primarily as automated, in other embodiments, method 1100 may permit user inputs at various places. For example, users may be permitted to select boundaries to weld, to thicken certain parts manually, to input cut planes or non-planar cut surfaces for splitting the geometry, etc.

Figure 12:
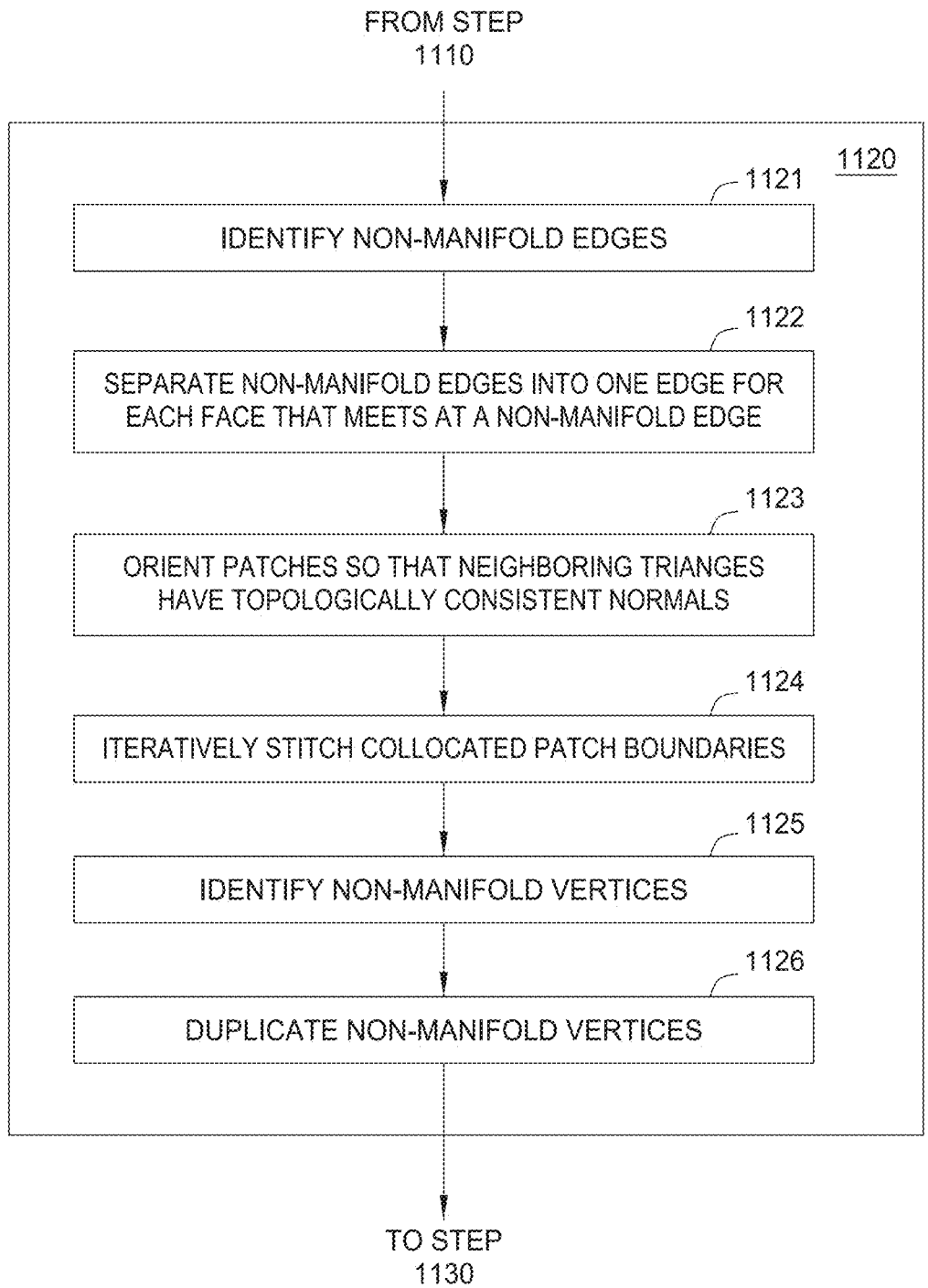
FIG. 12 illustrates one of the steps shown in FIG. 11, according to an embodiment of the invention.

FIG. 12 illustrates step 1120 of method 1100, according to an embodiment. At step 1121, the 3D PPA identifies non-manifold edges. One type of non-manifold edge is an edge associated with more than two faces. Another type of non-manifold edge is an edge associated with faces that are oriented inconsistently (i.e., have opposing normals). In one embodiment, the 3D PPA may identify non-manifold edges by walking across the edges and determining if a count of the number of triangles sharing any edge exceeds two, as well as if the triangles sharing any edge have inconsistent orientations.

At step 1122, the 3D PPA separates non-manifold edges into one edge for each face that meets at a non-manifold edge, creating a set of patches. Then, at step 1123, the 3D PPA orients the patches by enforcing that neighboring triangles have topologically consistent normals. Doing so removes non-manifold edges that are associated with faces having inconsistently oriented normals.

At step 1124, the 3D PPA iteratively stitches together coincident patch boundaries, according to criteria. For example, the criteria may specify that the 3D PPA begin with the longest zip which has not yet been stitched together, and with normals of faces having the largest dot product. As another example, the stitching criteria may, e.g., give preference to boundaries associated with patches forming substantially right angles, as this may be a right-angle corner of the geometry. After the iterative stitching together of coincident patch boundaries, the mesh may be free of non-manifold edges.

At step 1125, the 3D PPA identifies non-manifold verticies. For example, the 3D PPA may march the vertices to identify vertices that are part of more than one edge-connected surface component. Then, at step 1126, the 3D PPA duplicates the identified non-manifold vertices, assigning one vertex to one surface component and the other vertex to another surface component. Doing so separates the surface components, thereby eliminating the non-manifold vertices.

Figure 13:
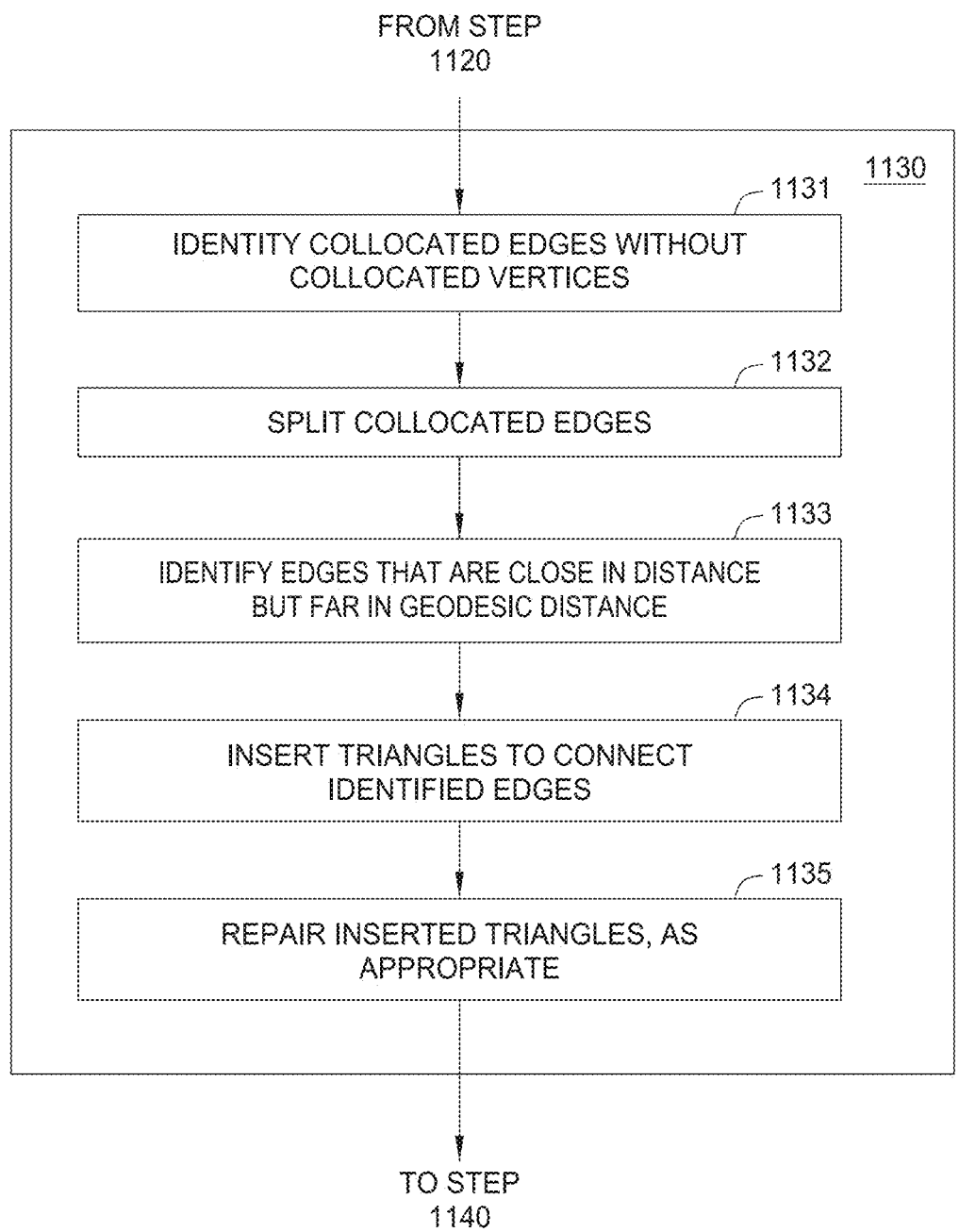
FIG. 13 illustrates another one of the steps shown in FIG. 11, according to an embodiment of the invention.

FIG. 13 illustrates step 1130 of method 1100, according to an embodiment. At step 1131, the 3D PPA identifies coincident edges that do not share coincident vertices. The 3D PPA may, e.g., compare coincident edges to determine whether those edges each include the same vertices. If such is not the case, then at step 1132, the 3D PPA splits one (or more) of the edges with the vertex or vertices which those edges lack. The resulting coincident edges may then share coincident vertices.

At step 1133, the 3D PPA identifies similar edges that are close in absolute distance but far in geodesic distance. Such edges may be close edges which are not actually coincident, such as those of the seam shown in panel C of FIG. 2. At step 1134, the 3D PPA inserts triangles to connect the identified edges. At step 1135, the 3D PPA repairs the inserted triangles, as appropriate. As discussed, triangles inserted into seams may be small or thin. The 3D PPA may repair the inserted triangles by, e.g., performing edge flips, decimations, edge collapses, etc., thereby reducing the number of small or thin triangles.

Figure 14:
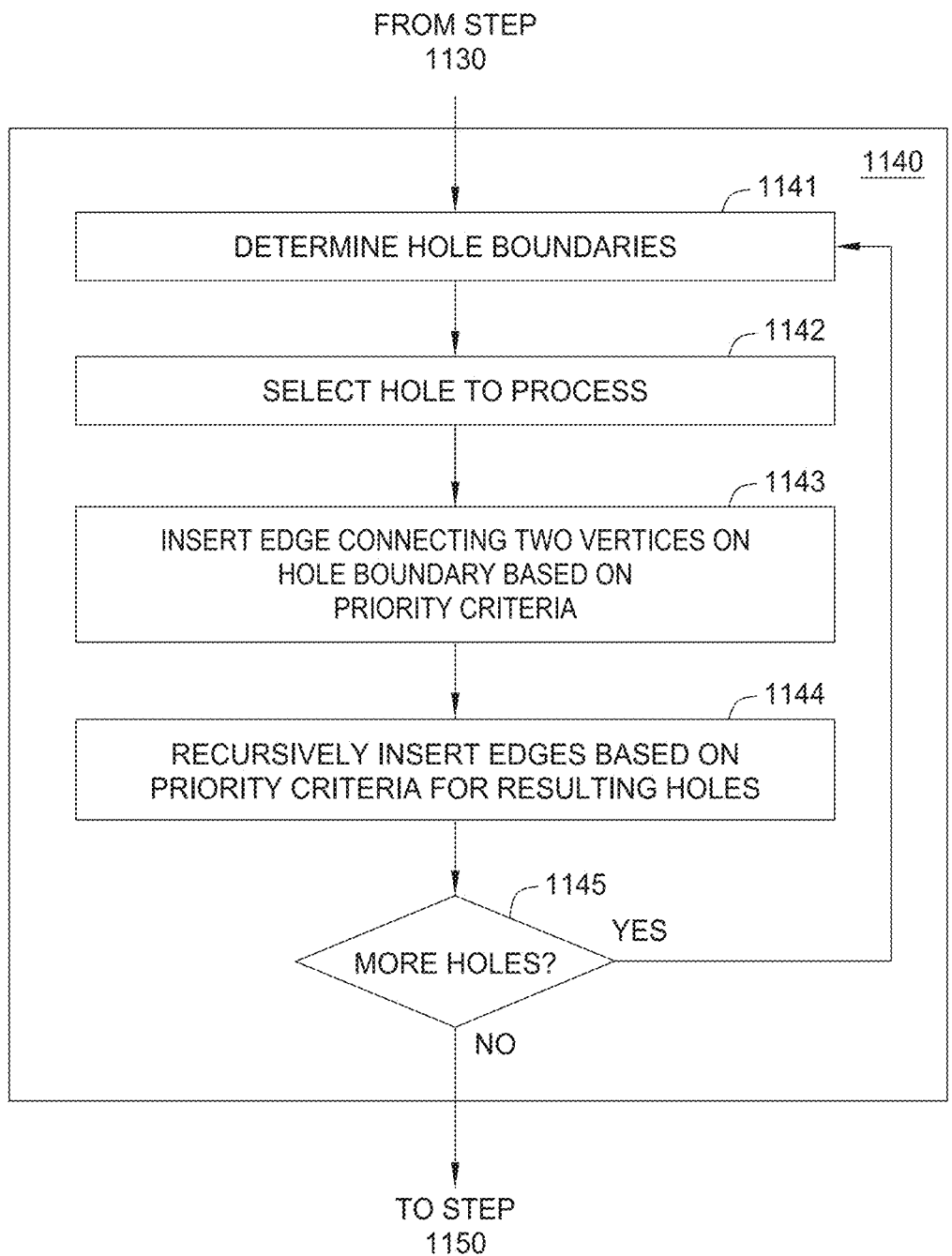
FIG. 14 illustrates another one of the steps shown in FIG. 11, according to an embodiment of the invention.

FIG. 14 illustrates step 1140 of method 1100, according to an embodiment. At step 1141, the 3D PPA determines boundaries of holes in the geometry. The 3D PPA may, e.g., march the triangle mesh to identify closed loops of vertices which do not enclose geometry and are thus hole boundaries.

At step 1142, the 3D PPA selects a hole to process. In one embodiment, the 3D PPA may simply iterate through all unfilled holes. At step 1143, the 3D PPA inserts an edge connecting two vertices on a boundary of the selected hole based on priority criteria. Doing so connects two boundary vertices, defining a new triangle. Experience has shown that useful priorities include shortest edges first, edges along a preferred direction first, and edges that are closest to a predefined surface first. Particularly for large holes, it may be necessary to avoid intersections of the new surface filling the hole with existing geometry. The 3D PPA may be configured to check for such intersections while inserting edges, and, after an intersection is identified, split the new triangle and move the split point to avoid the intersection. This process may be repeated recursively to until all intersections are avoided. Note, the 3D PPA may instead fail to find an intersection-free surface to file a hole. In such cases, the 3D PPA may simply fill the hole without considering intersections, and then compute the boolean union of volumes defined by the final, closed mesh, as the output mesh.

At step 1144, the 3D PPA recursively inserts edges based on the priority criteria for hole(s) that result from previously inserted edges. This process repeats until the selected hole is completely filled. Then, at step 1145, the 3D PPA determines if more holes remain, and, if this is the case, the method 1100 returns to step 1141, where the 3D PPA selects another hole to process. In some embodiments, the 3D PPA automatically fills the holes. In alternative embodiments, the user may be given some control over the hole-filling process, such as the ability to modify the surface patches inserted for any particular hole, to manually resolve intersections, or to control the shape of the inserted geometry. Any feasible free-form deformation technique may be used to permit these user interventions.

Figure 15:
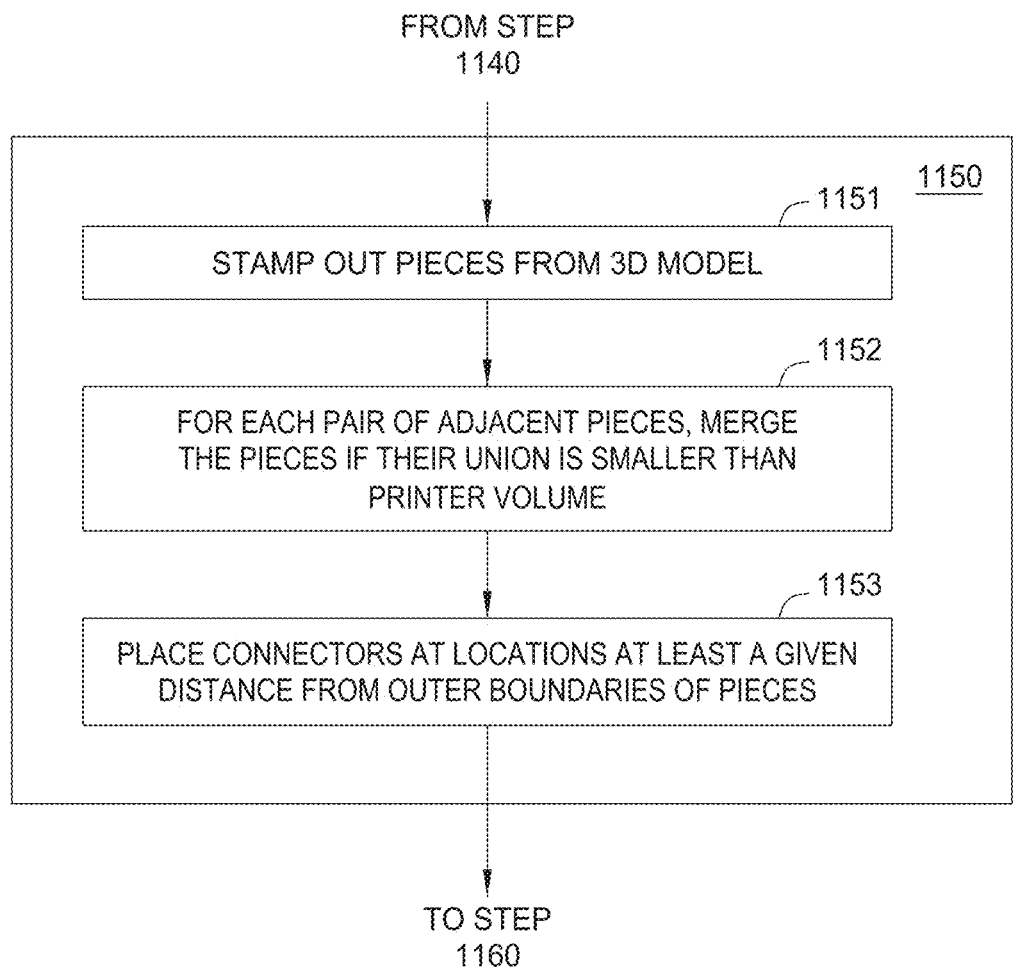
FIG. 15 illustrates another one of the steps shown in FIG. 11, according to an embodiment of the invention.

FIG. 15 illustrates step 1150 of method 1100, according to an embodiment. At step 1151, the 3D PPA stamps out pieces from the 3D model. In one embodiment, the 3D PPA may determine the intersection of the 3D geometry with a box (or other shape) which represents the printing volume, and split the 3D geometry along the intersections. At step 1152, the 3D PPA merges pairs of adjacent pieces if their union is smaller than the printer volume. Such merging does not affect printability, as the 3D PPA first checks that the adjacent pieces are capable of printed as one pieces, i.e., fit in the printing volume as one piece. Then, at step 1153, the 3D PPA places connectors at locations at least a given distance from outer boundaries of the piece. For example, the 3D PPA may choose a random placement location for the connector, then determine whether the location is at least a given distance from the outer boundary. If not, then the connector may make a number of further attempts, until a suitable location is found or no suitable location is found a user is notified about this error. In other embodiments, the 3D PPA may attempt to place multiple connectors as far from each other as possible, or equally spaced from each other. Various types of connectors may be used, such as those depicted in FIG. 5. The particular connectors used may depend on, e.g., the desired number of degrees of freedom, the kind of object being split, where the split is located, etc.

In alternative embodiments, the 3D PPA may split large meshes in other ways. In one embodiment, the 3D PPA may cut the meshes in places having maximum cross section so that many connectors may be placed to join the pieces. In another embodiment, the 3D PPA may cut the meshes in places having minimum cross section, as those places are already weak. In a further embodiment, the 3D PPA may place cuts to so as to produce minimal visible seams. In yet another embodiment, the 3D PPA may determine intersections necessary to separate the geometry based on a user-specified location. For example, the 3D PPA may choose a cut plane close to the user-specified location and walk on the mesh in all directions as far as possible without crossing the cut plane and mark that region as belonging to one piece, and identify other pieces in a similar manner. As discussed, the 3D PPA may also handle instances where one surface includes another surface within it from a cross-sectional viewpoint. For example, the 3D PPA may identify intersection curves, and where one intersection curve contains another, smaller intersection curve, the 3D PPA may cut both.

Figure 16:
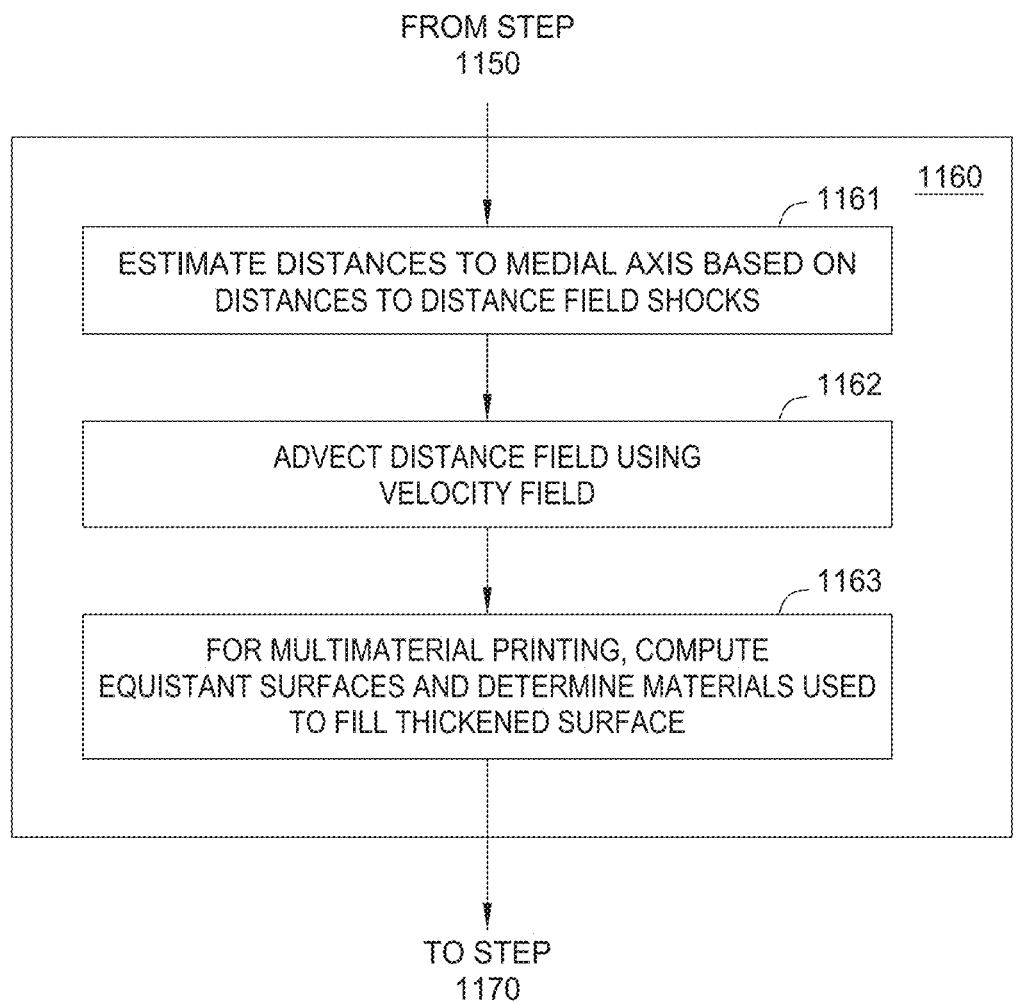
FIG. 16 illustrates another one of the steps shown in FIG. 11, according to an embodiment of the invention.

FIG. 16 illustrates step 1160 of method 1100, according to an embodiment. At step 1161, the 3D PPA estimates distances to a medial axis based on distances to distance field shocks. Here, the distance field may be a vector field having normals pointing away from the surface of the object. Shocks in the distance field occur where normals of the distance field change abruptly, and are not $C_1$ continuous. The 3D PPA may compute the distance field for the object and identify shocks in the distance field, which the 3D PPA may use as approximations of the locations of medial axis points. The 3D PPA may then determine the distance of surface points to those medial axis point approximations.

At step 1162, the 3D PPA advects the distance field using a velocity field to thicken parts of the object. In one embodiment, the distance field Ψ may be advected using the velocity field:

$$\vec{v}(\vec{x}) = \nabla \Psi(\vec{v}) \cdot q(\vec{x}), \tag{1}$$

where $q(\vec{x})$ is an indicator of whether or not the local feature size $L(\vec{x})$, i.e., the distance of a point $\vec{x}$ on the surface to the medial axis of the shape, is smaller than the printer resolution R:

$$q(\vec{x}) = \begin{cases} 1 & \text{if } L(\vec{x}) < R \\ 0 & \text{otherwise.} \end{cases} \tag{2}$$

Here, the 3D PPA may move the surface of the 3D geometry by changing an implicit representation of the surface. The distance field gives a distance to the surface, e.g., at various discrete grid points, and is moved according to the velocity field. The grid may then be resampled to give a new distance field, with the new surface where this distance field is 0.

In one embodiment, the 3D PPA may avoid destroying details by deleting only those parts of the object that were moved by advection (i.e., those parts with $L(\vec{x}) < R$). The 3D PPA may then extract the surface of the advected distance field in cells that have moved significantly (e.g., by at least some threshold amount). The 3D PPA may then stitch these parts together to form a new watertight surface.

At step 1163, the 3D PPA computes, for multimaterial printing, equidistant surfaces and determines, using the equidistance surfaces, materials to fill the thickened surface. Doing so permits the internal divisions between the materials in the original object to be extended to new regions resulting from the thickening process. For each part of the object having a unique material, the 3D PPA may determine an implicit surface that is equidistant from that part and the union of all other parts having respective unique materials. Here, volumes bounded by the outer surface, the implicit surface, and the original surface before thickening, may each be filled with the same material as that of the part closest to the respective volume. In one embodiment, the 3D PPA may determine an intersection between the outer surface, after thickening, and the implicit surface to identify such volumes. The 3D PPA may then mark those volumes for printing with the appropriate materials.

Figure 17:
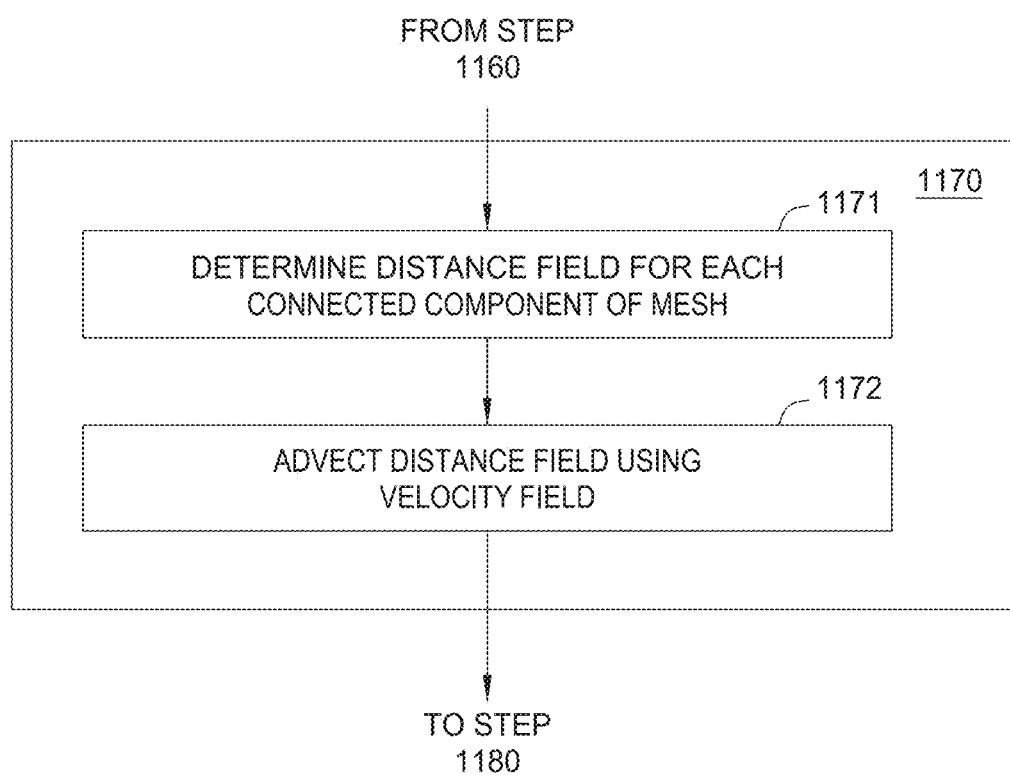
FIG. 17 illustrates another one of the steps shown in FIG. 11, according to an embodiment of the invention.

FIG. 17 illustrates step 1170 of method 1100, according to an embodiment. At step 1171, the 3D PPA determines a distance field for each connected component of the mesh. As discussed, the distance field may be a vector field having normals pointing away from the surface of the object.

At step 1172, the 3D PPA advects the distance field using a velocity field. In one embodiment, the distance field $\Psi$ may be advected using the velocity field:

$$\vec{v}(\vec{x}) = -\nabla \Psi(\vec{x}) \cdot g(\vec{x}), \quad (3)$$

where $q(\vec{x})$ is an indicator of whether or not the distance $D(\vec{x})$ to the closest point of any other (but not the same) component is less than R:

$$g(\vec{x}) = \begin{cases} 1 & \text{if } D(\vec{x}) < R \\ 0 & \text{otherwise.} \end{cases} \quad (4)$$

Note, the velocity field $\vec{v}(\vec{x})$ is inverted, meaning one component retracts away from the other component if those components are sufficiently close together (i.e., if $D(\vec{x}) < R$), while the components are not moved relative to each other if those components are not closer than the threshold. Similar to thickening, the 3D PPA may perform remeshing and stitching of parts to generate a new, watertight surface.

Figure 18:
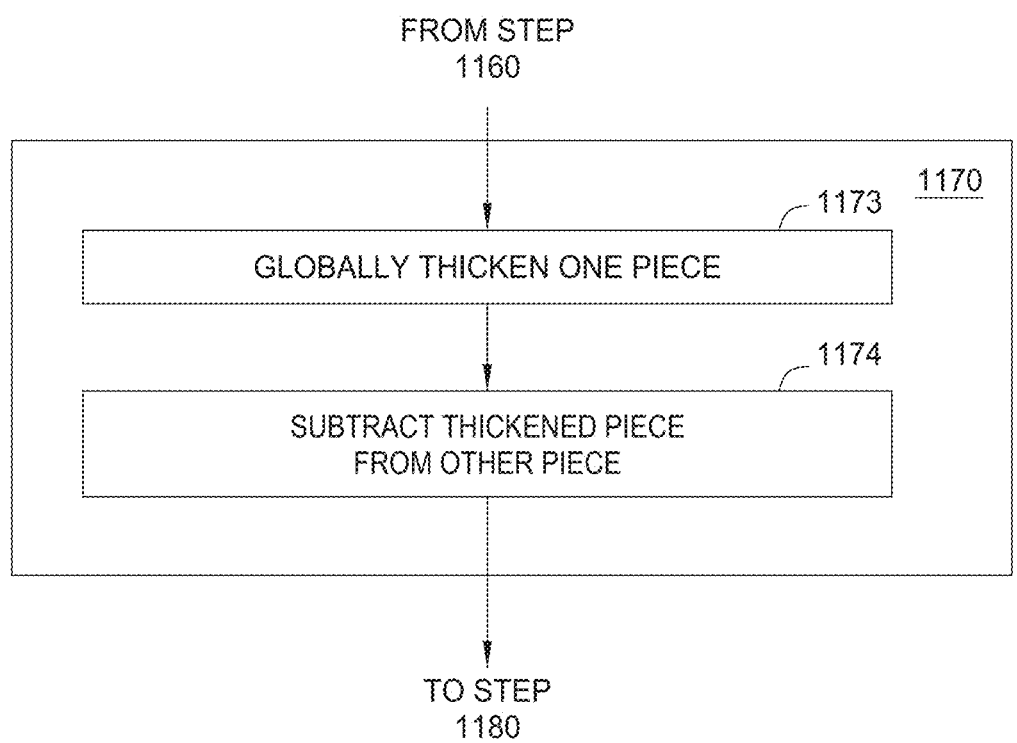
FIG. 18 illustrates the step of FIG. 11 shown in FIG. 17, according to an alternative embodiment of the invention.

FIG. 18 illustrates an alternative to the steps shown in FIG. 17, according to an embodiment. At step 1173, the 3D PPA globally thickens one piece. That is, the 3D PPA thickens the piece everywhere, as opposed to only where the piece is below, e.g., some distance threshold from the other piece. Then, at step 1174, the 3D PPA subtracts the thickened piece from the other piece. Similar to thickening, the 3D PPA may perform remeshing and stitching of parts to create a new, watertight surface.

Figure 19:
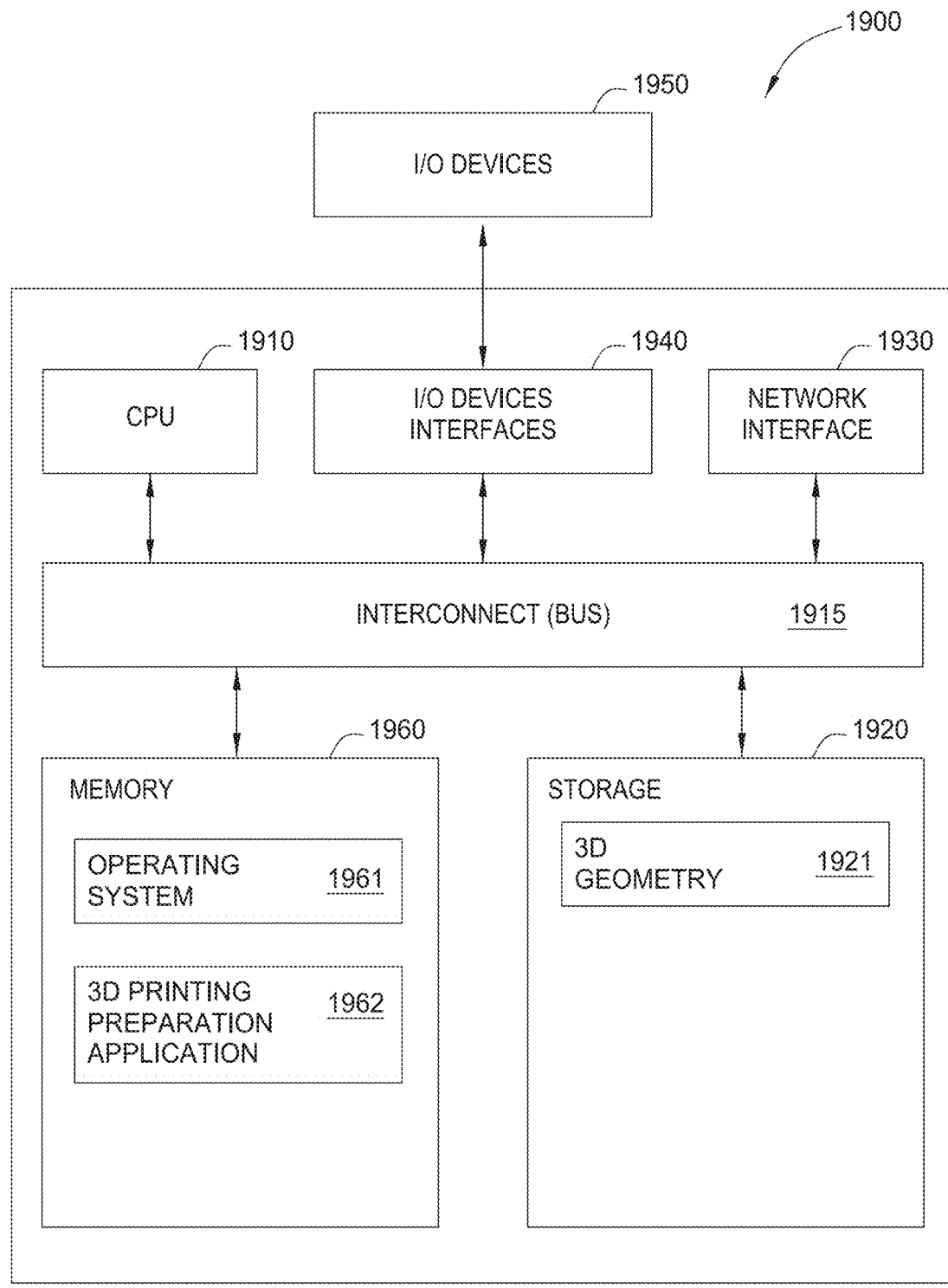
FIG. 19 illustrates a computer system configured to implement one or more aspects of the present invention.

FIG. 19 illustrates a computer system 1900 configured to implement one or more embodiments. As shown, the system 1900 includes, without limitation, a central processing unit (CPU) 1910, a network interface 19190, an interconnect 1915, a memory 1960, and storage 1920. The system 1900 may also include an I/O device interface 1940 connecting I/O devices 1950 (e.g., keyboard, display and mouse devices) to the system 1900.

The CPU 1910 retrieves and executes programming instructions stored in the memory 1960. Similarly, the CPU 1910 stores and retrieves application data residing in the memory 1960. The interconnect 1915 facilitates transmission, such as of programming instructions and application data, between the CPU 1910, I/O device interface 1940, storage 1920, network interface 19190, and memory 1960. CPU 1910 is included to be representative of a single CPU, multiple CPUs, a single CPU having multiple processing cores, and the like. And the memory 1960 is generally included to be representative of a random access memory. The storage 1920 may be a disk drive storage device. Although shown as a single unit, the storage 1920 may be a combination of fixed and/or removable storage devices, such as fixed disc drives, floppy disc drives, tape drives, removable memory cards or optical storage, network attached storage (NAS), or a storage area-network (SAN). Further, system 1900 is included to be representative of a physical computing system as well as virtual machine instances hosted on a set of underlying physical computing systems. Further still, although shown as a single computing system, one of ordinary skill in the art will recognized that the components of the system 1900 shown in FIG. 19 may be distributed across multiple computing systems connected by a data communications network.

As shown, the memory 1960 includes an operating system 1961 and a 3D printing preparation application 1962. Illustratively, the operating system may include Microsoft's Windows®. The 3D printing preparation application 1962 is configured to prepare input 3D geometry for printing, and display a 3D print preview of the appearance of the printed object. In one embodiment, the 3D printing preparation application 1962 may repair the input geometry, including eliminating holes, non-manifold edges, and non-manifold vertices; split large models and add connectors; perform resolution aware thickening; perform resolution-aware separation enforcement or separation enforcement by subtracting a globally thickened component; and generating a 3D print preview, according to the method 1100 discussed above. Of course, in other embodiments, one or more of these aspects may be omitted, and/or other aspects added. For example, the 3D printing preparation application 1962 may not perform resolution-aware thickening, or split large models, etc.

Advantageously, embodiments presented herein permit 3D printers to print geometry (e.g., encoded as STereo-Lithography (STL) or Additive Manufacturing File Format (AMF) files) without tedious pre-processing, and to print, in a piecemeal manner, large models that would otherwise not fit within the printing volume of the printer. Further, thickening techniques disclosed herein overcome printer resolution limitations by expanding small features so that such features are not smoothed out or eliminated, and so that parts connected by thin features are not disconnected, by the printing process. Conversely, separation enforcement techniques disclosed herein separate neighboring pieces so that the pieces are not fused during printing due to resolution or accuracy limitations. In addition, the 3D print preview disclosed herein shows a user a simulation of the actual appearance and surface properties of printed objects, which may otherwise not be known until after the object is printed.

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention. Therefore, the scope of the present invention is determined by the claims that follow.

We claim:

1. A computer-implemented method for preparing geometry for 3D printing, comprising:
   receiving the 3D geometry;
   estimating distances from points on a surface of the 3D geometry to a medial axis of the 3D geometry based on distances to shocks of a distance field; and
   advecting the distance field using a velocity field to thicken portions of the 3D geometry.

2. The computer-implemented method of claim 1, wherein the shocks occur where the distance field is not $C_1$ continuous.

3. The computer-implemented method of claim 1, wherein the velocity field comprises an indicator that is set to 1 where the estimated distance to the medial axis is less than a printer resolution R and is set to 0 otherwise.

4. The computer-implemented method of claim 1, further comprising:
   deleting geometry that is affected by the advection;
   extracting a surface of the advected distance field in cells that have moved significantly; and
   stitching the extracted surface together to form a new watertight surface.

5. The computer-implemented method of claim 1, wherein the 3D geometry is to be filled with a plurality of materials, further comprising:
   for each part of the geometry to be filled with a unique material, determining a surface that is equidistant from the respective part and the union of all other parts having respective unique materials; and
   filling volumes bounded by the outer surface of the geometry, the equidistance surfaces, and the original surface before thickening, with the same material as that of the part of the geometry filled with the unique material that is closest to the respective volumes.

6. A non-transitory computer-readable medium including instructions that, when executed by a processor, cause the processor to perform the steps of:
   receiving a three-dimensional (3D) geometry;
   estimating distances from points on a surface of the 3D geometry to a medial axis of the 3D geometry based on distances to shocks of a distance field; and
   advecting the distance field using a velocity field to thicken portions of the 3D geometry.

7. The non-transitory computer-readable medium of claim 6, wherein the shocks occur where the distance field is not $C_1$ continuous.

8. The non-transitory computer-readable medium of claim 6, wherein the velocity field comprises an indicator that is set to 1 where the estimated distance to the medial axis is less than a printer resolution R and is set to 0 otherwise.

9. The non-transitory computer-readable medium of claim 6, further comprising:
   deleting geometry that is affected by the advection;
   extract a surface of the advected distance field in cells that have moved significantly; and
   stitching the extracted surface together to form a new watertight surface.

10. The non-transitory computer-readable medium of claim 6, wherein the 3D geometry is to be filled with a plurality of materials, further comprising:
    for each part of the geometry to be filled with a unique material, determining a surface that is equidistant from the respective part and the union of all other parts having respective unique materials; and
    filling volumes bounded by the outer surface of the geometry, the equidistance surfaces, and the original surface before thickening, with the same material as that of the part of the geometry filled with the unique material that is closest to the respective volumes.

11. A computer system, comprising:
    a memory storing instructions; and
    a processor that is coupled to the memory and, when executing the instructions, performs the steps of:
    receiving a three-dimensional (3D) geometry;
    estimating distances from points on a surface of the 3D geometry to a medial axis of the 3D geometry based on distances to shocks of a distance field; and
    advecting the distance field using a velocity field to thicken portions of the 3D geometry.

12. The computer system of claim 11, wherein the shocks occur where the distance field is not $C_1$ continuous.

13. The computer system of claim 11, wherein the velocity field comprises an indicator that is set to 1 where the estimated distance to the medial axis is less than a printer resolution R and is set to 0 otherwise.

14. The computer system of claim 11, wherein the processor further performs the steps of:
    deleting geometry that is affected by the advection;
    extracting a surface of the advected distance field in cells that have moved significantly; and
    stitching the extracted surface together to form a new watertight surface.

15. The computer system of claim 11, wherein the 3D geometry is to be filled with a plurality of materials, and the processor further performs the steps of:
    for each part of the geometry to be filled with a unique material, determining a surface that is equidistant from the respective part and the union of all other parts having respective unique materials; and
    filling volumes bounded by the outer surface of the geometry, the equidistance surfaces, and the original surface before thickening, with the same material as that of the part of the geometry filled with the unique material that is closest to the respective volumes.

* * * * *